(12) United States Patent
Kadono et al.

(10) Patent No.: US 7,525,656 B2
(45) Date of Patent: Apr. 28, 2009

(54) EXPOSURE APPARATUS AND DEVICE FABRICATION METHOD

(75) Inventors: Ayako Kadono, Utsunomiya (JP); Haruna Kawashima, Haga-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 418 days.

(21) Appl. No.: 11/463,657

(22) Filed: Aug. 10, 2006

(65) Prior Publication Data
US 2007/0046922 A1 Mar. 1, 2007

(30) Foreign Application Priority Data
Aug. 24, 2005 (JP) ............................. 2005-242033

(51) Int. Cl.
*G01J 4/00* (2006.01)
(52) U.S. Cl. ..................................... 356/364
(58) Field of Classification Search ................ 356/364, 356/369; 250/559.09, 225
See application file for complete search history.

(56) References Cited
U.S. PATENT DOCUMENTS
2004/0114150 A1 6/2004 Wegmann et al.

2006/0250615 A1 * 11/2006 Fukuhara .................... 356/364
2008/0043236 A1 * 2/2008 Kaise et al. ................. 356/364

FOREIGN PATENT DOCUMENTS

| JP | 3-288976 | 12/1991 |
|----|----------|---------|
| JP | 2000-56133 | 2/2000 |
| JP | 2004-61515 | 2/2004 |

* cited by examiner

*Primary Examiner*—Roy Punnoose
(74) *Attorney, Agent, or Firm*—Locke Lord Bissell & Liddell LLP

(57) ABSTRACT

An exposure apparatus includes a reticle stage for supporting a reticle, an illumination optical system for illuminating the reticle, a projection optical system for projecting an image of a pattern of the reticle onto a substrate, a polarization state measuring part for measuring a polarization state, and an optical unit, supported by the reticle stage exchangeable for the reticle, for introducing a light from the illumination optical system to the polarization state measuring part, wherein said polarization state measuring part includes a phase shifter, a polarization element, and a light detector for detecting the light from the illumination optical system via the phase shifter and the polarization element.

13 Claims, 28 Drawing Sheets

EXPOSURE APPARATUS AND DEVICE FABRICATION METHOD

BACKGROUND OF THE INVENTION

The present invention relates generally to an exposure apparatus, and more particularly to a measurement of a polarization state of an exposure light and projection optical system used for the exposure apparatus that exposes a substrate, such as a single crystal substrate for a semiconductor, and a glass plate for a liquid crystal display.

A conventional projection exposure apparatus uses a projection optical system to project and transfer a circuit pattern of a reticle (or a mask) onto a wafer, etc., in manufacturing a semiconductor device in a photolithography technology.

The projection exposure apparatus has three important factors, resolution, overlay accuracy, and throughput, as a factor that determines an exposure performance. Recently, particularly concerning to the resolution among these three factors, a higher numerical aperture (NA) of the projection optical system by an immersion exposure attracted people's attentions. The higher NA of the projection optical system, which is referred to as a high NA imaging, means an increase of an angle between a perpendicular to an image surface and a traveling direction of an incident light.

A polarization state of the exposure light is important in the high NA imaging. For example, assume exposure of a so-called line and space (L & S) pattern that has repetitive lines and spaces. The L & S pattern is formed by a plane wave two light interference. An incident plane is defined as a plane including incident vectors of two lights, a S-polarized light is a polarized light perpendicular to the incident plane, and a P-polarized light is a polarized light parallel to the incident plane. When an angle is 90 degrees between the incident vectors of two lights, the two S-polarized lights interfere with each other, forming a light intensity distribution corresponding to the L & S pattern on the image surface. On the other hand, the two P-polarized lights neither interfere with and cancel with each other, nor form the light intensity distribution corresponding to the L & S pattern on the image surface. The light intensity distribution with a blend of the S-polarized light and the P-polarized light has a lower contrast on the image surface than that with only the S-polarized light. As a ratio of the P-polarized light increases, the contrast of the light intensity distribution lowers on the image surface, and the pattern is not formed at last.

Thus, it is necessary to control the polarization of the exposure light and to improve the contrast. The polarization-controlled exposure light forms a light intensity distribution having a sufficient contrast on the image surface, and realizes a fine pattern resolution.

An illumination optical system, more specifically, a pupil in the illumination optical system controls a polarization state of the exposure light. A polarization illumination requires illuminating using an effective light source having an effective form to a certain pattern and an optimal polarization direction. For example, a X dipole illumination having the polarization direction in a Y direction is effective to a Y direction pattern. Moreover, a tangential illumination having the polarization direction in a circumferential direction of an annular is effective to a pattern that includes patterns in various directions.

However, even when the pupil in the illumination optical system controls the polarization of the exposure light, the polarization state controlled at the pupil in the illumination optical system is not always maintained up to the image surface due to the influences of the optical system subsequent to the pupil in the illumination optical system and/or the projection optical system. For example, although a lens or a reflecting mirror has an antireflection coating or a high reflection coating to improve the transmittance or the reflectance, a reflectance is different according to the polarization direction and an element that changes the polarization by applying a phase difference exists. A crystal material, such as quartz and fluorite, is used as glass materials according to a shorter wavelength of the exposure light. These glass materials include a birefringence and change the polarization state. Moreover, the birefringence included in the glass materials changes by a stress of a mechanical member, such as a lens barrel, that maintains the glass materials. Therefore, it is very difficult to always maintain the birefringence of the glass materials to a constant.

Thus, it is necessary to measure a polarization state of the exposure apparatus, in other words, a polarization state of the projection optical system. For example, the exposure apparatus that includes a measuring means on a wafer stage and can measure the polarization state at a wafer side in the projection optical system. See, for example, Japanese Patent Application, Publication No. 2004-61515.

On the other hand, in a higher resolution and a critical dimension control, the importance for measurement and control of an effective light source distribution of the illumination optical system is also recognized. The effective light source distribution of the illumination optical system means, for example, a size, form and light intensity distribution of a light source image on an entrance pupil plane to a size of the entrance pupil plane in the projection optical system in the projection exposure apparatus that uses a Koehler illumination. In measurement of this effective light source form, the measuring means is provided on the wafer stage, and the effective light source form is measured via the projection optical system.

Thus, in the recently projection exposure apparatus, the highly accuracy measurement of the polarization state on the exposure apparatus is a necessary matter.

However, prior art that provides the measuring means on the wafer stage includes various problems, when applying to the recently projection exposure apparatus.

The most serious problem is as follows. The influence on the polarization state on the exposure apparatus by each factor of the illumination optical system and the projection optical system cannot be separated and measured. In the prior art, the polarization state of the illumination optical system and the projection optical system (hereinafter, referred to as an "exposure optical system") on the wafer surface is usually measured without arranging the reticle (in a state of only $0^{th}$ light). In such measurement, since the polarization state of the illumination optical system and the polarization state of the projection optical system are cancelled, a seemingly good polarization state may be measured. However, in actual pattern transfer, the reticle is arranged between the illumination optical system and the projection optical system. Therefore, if the circuit pattern on the reticle is illuminated, not only the $0^{th}$ light that transmits the reticle but high order diffracted lights according the circuit pattern occurs. Each of such $0^{th}$ light and high order diffracted lights passes different optical paths in the projection optical system, condenses on the wafer and forms the pattern image. Then, even if the polarization state is good at the measurement of the polarization state on the wafer surface, the polarization state of each high order diffracted light on the optical path is different. As a result, the imaging performance becomes asymmetry, and defective resolution is caused.

Moreover, an optical member to measure the polarization with high accuracy cannot be arranged by a restriction of space on the wafer stage. For example, on a periphery of a lens, an internal stress by a maintenance occurs and the birefringence of the glass materials is changed. Therefore, a measurement error by change of the polarization state occurred in the measuring means is included in a measurement value.

In addition, a polarization element and a phase shifter cannot be arranged in the measuring means by the restriction of space on the wafer stage. Then, the polarization state of the projection optical system is obtained by measuring the illumination light, which has been polarization-controlled by the illumination optical system, by the measuring means that does not have a function of polarization measurement on the wafer stage. Therefore, the highly accuracy polarization measurement including a phase change cannot be executed.

The measuring means also needs the higher NA corresponding to the higher NA by the immersion exposure. However, it is difficult to provide the measuring means with high NA on the wafer stage.

BRIEF SUMMARY OF THE INVENTION

Accordingly, the present invention is directed to an exposure apparatus that can measure an optical characteristic (particularly, a polarization state) of an illumination optical system or a projection optical system with high accuracy on the exposure apparatus.

An exposure apparatus of one aspect of the present invention includes a reticle stage for supporting a reticle, an illumination optical system for illuminating the reticle, a projection optical system for projecting an image of a pattern of the reticle onto a substrate, a polarization state measuring part for measuring a polarization state, and an optical unit, supported by the reticle stage exchangeable for the reticle, for introducing a light from the illumination optical system to the polarization state measuring part, wherein said polarization state measuring part includes a phase shifter, a polarization element, and a light detector for detecting the light from the illumination optical system via the phase shifter and the polarization element.

An exposure apparatus according to another aspect of the present invention includes a substrate stage for supporting a substrate, a projection optical system for projecting an image of a pattern of a reticle onto the substrate, a polarization state measuring part for measuring a polarization state, and a mirror, provided on the substrate stage, for reflecting a light exited from the projection optical system and introducing the light to the projection optical system, wherein said polarization state measuring part includes a phase shifter, a polarization element, and a light detector, wherein said light detector detects the light that passes the projection optical system, the mirror, the projection optical system, the phase shifter and the polarization element in this order.

An exposure apparatus according to still another aspect of the present invention includes a reticle stage for supporting a reticle, an illumination optical system for illuminating the reticle, a substrate stage for supporting a substrate, a projection optical system for projecting an image of a pattern of the reticle onto the substrate, a polarization state measuring part for measuring the polarization state, an optical unit supported by the reticle stage exchangeable for the reticle, and a mirror, provided on the substrate stage, for reflecting a light exited from the projection optical system and introducing the light to the projection optical system, wherein said polarization state measuring part includes, a phase shifter, a polarization element, and a light detector, wherein said light detector detects the light from the illumination optical system through the projection optical system, the mirror, the projection optical system, the optical unit, the phase shifter and the polarization element in this order.

An exposure method according to still another aspect of the present invention for exposing a substrate using an illumination optical system that illuminates a reticle and a projection optical system that projects an image of a pattern of the reticle onto the substrate, said exposure method includes a first measurement step of measuring a polarization state of a light to illuminate the reticle, a second measurement step of measuring a polarization characteristic of the projection optical system, and a calculation step of calculating an imaging state of the image of the pattern based on measurement results by the first and second measurement steps.

An exposure apparatus according to still another aspect of the present invention includes a reticle stage for supporting a reticle, an illumination optical system for illuminating the reticle, a projection optical system for projecting an image of a pattern of the reticle onto a substrate, a polarization state measuring part for measuring a polarization state, and an optical unit, supported by the reticle stage exchangeable for the reticle, for introducing a light from the illumination optical system to the polarization state measuring part.

An exposure apparatus according to still another aspect of the present invention includes a substrate stage for supporting a substrate, a projection optical system for projecting an image of a pattern of a reticle onto the substrate, a polarization state measuring part for measuring a polarization state, and a mirror, provided on the substrate stage, for reflecting a light exited from the projection optical system and introducing the light to the projection optical system.

An exposure apparatus according to still another aspect of the present invention includes a reticle stage for supporting a reticle, an illumination optical system for illuminating the reticle, a substrate stage for supporting a substrate, a projection optical system for projecting an image of a pattern of the reticle onto the substrate, a polarization state measuring part for measuring the polarization state, an optical unit supported by the reticle stage exchangeable for the reticle, and a mirror, provided on the substrate stage, for reflecting a light exited from the projection optical system and introducing the light to the projection optical system.

A device fabricating method according to still another aspect of the present invention includes the steps of exposing a substrate using the above exposure apparatus, and performing a development process for the substrate exposed.

Other objects and further features of the present invention will become readily apparent from the following description of the preferred embodiments with reference to the accompanying drawings.

DETAILED DESCRIPTION OF THE PREFERRED EMBODIMENTS

Figure 1:
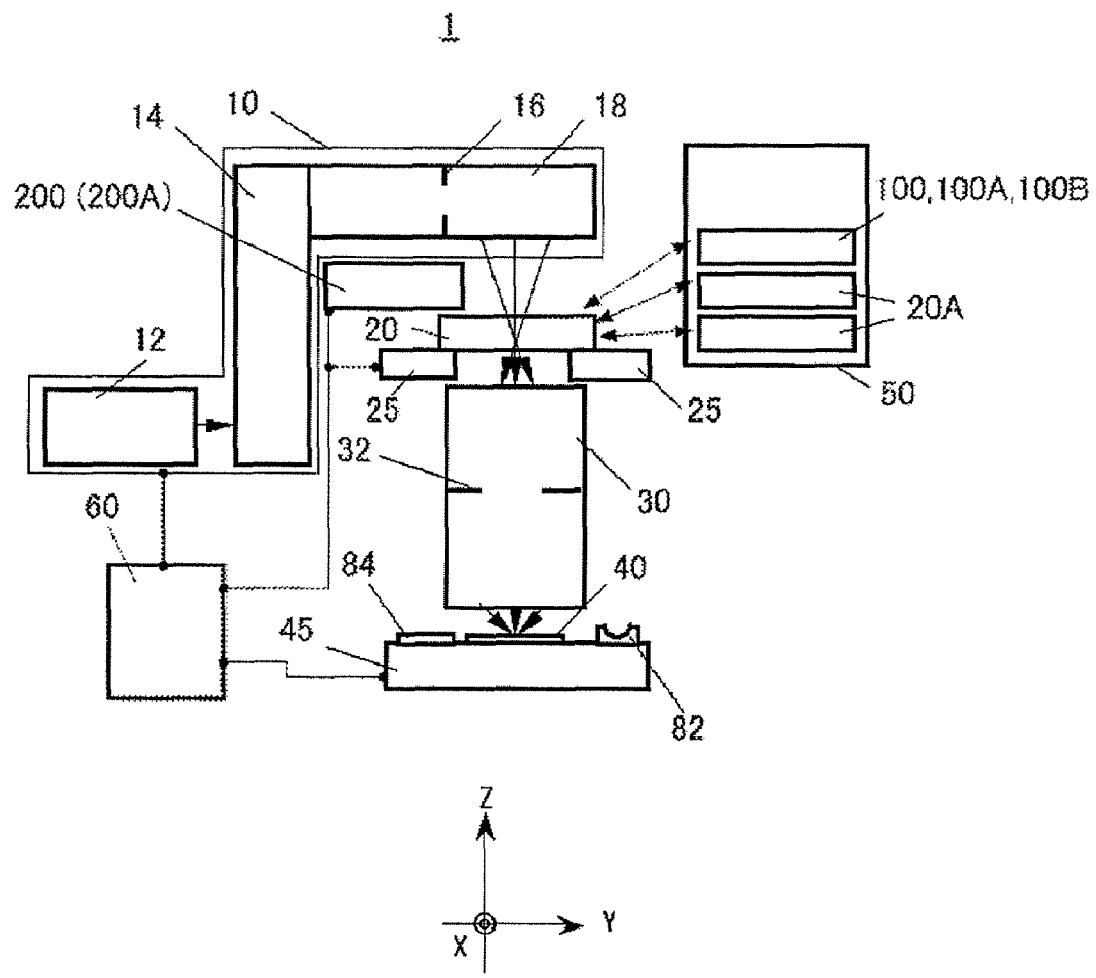
FIG. 1 is a schematic sectional view of an exposure apparatus of one aspect according to the present invention.

Referring now to the accompanying drawings, a description will be given of preferred embodiments of the present invention. In each figure, the same reference numeral denotes the same element. Therefore, duplicate descriptions will be omitted.

First Embodiment

FIG. 1 is a schematic sectional view of an exposure apparatus 1 of one aspect according to the present invention.

In FIG. 1, 10 is an illumination apparatus. The illumination apparatus 10 includes a light source part 12, such as a laser, an illumination system beam delivery unit 14, a masking blade 16, and an illumination optical system 18.

A light from the light source part 12 is changed into a desired polarization state and a desired light intensity distribution by the illumination optical system 18, and illuminates a reticle 20 supported by a reticle stage 25. The illumination optical system 18 can limit an illumination area on the reticle 20 to a desired area by the masking blade 16 that has a variable opening.

A pattern is formed in a bottom surface of the reticle 20. The diffracted light from the pattern images onto a wafer (substrate) 40 supported by a wafer stage (substrate stage) 45 via a projection optical system 30. Thereby, the pattern of the reticle is transferred. Photoresist is applied to the wafer 40.

The exposure apparatus 1 includes a reticle stocker 50. The reticle stocker 50 stores plural reticles 20A having a pattern that is different from the pattern of the reticle 20, and optical units 100, 100A and 100B described later. The exposure apparatus 1 can exchange the reticle 20 on the reticle stage 25 for the reticle 20A and the optical units 100, 100A and 100B stored in the reticle stocker 50 using a reticle exchanging part (not shown) according to an exposure process.

60 is a controller including a console that inputs a command. The controller 60 controls the whole exposure apparatus, such as the illumination apparatus 10, the reticle stage 25, the wafer stage, and the reticle exchanging part (not shown).

The optical unit 100 includes plural optical elements as described later. The optical unit 100 is used for the measurement of each optical characteristic of the illumination optical system 18 and the projection optical system 30 and the measurement of the whole optical characteristic of the illumination optical system 18 and the projection optical system 30. The optical unit 100 has the almost same form as the reticle 20, and is supported by the reticle stage 25 of the exposure apparatus 1 like the reticle 20. In FIG. 1, the optical unit 100 is stored in the reticle stocker 50.

Figure 2:
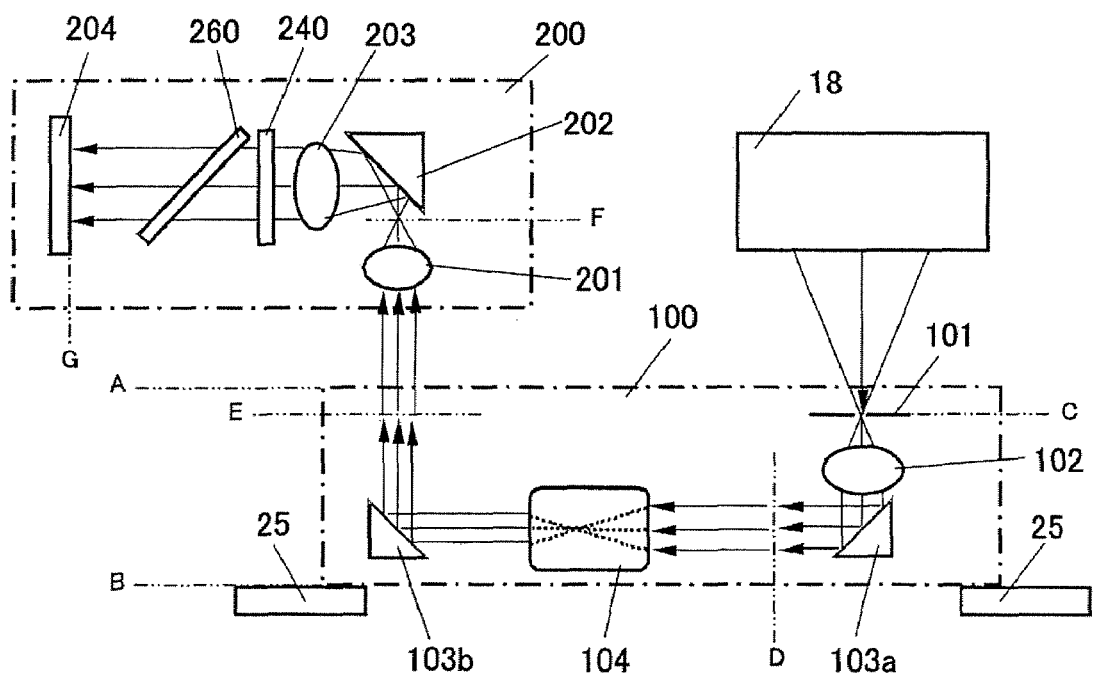
FIG. 2 is a partially sectional view of an optical unit shown in FIG. 1 that is supported by a reticle stage.

Here, referring to FIG. 2, a description will be given of a concretely structure of the optical unit 100 and a measurement of the optical characteristic of the illumination optical system 18 using the optical unit 100 and a observation optical system 200. FIG. 2 is a partially sectional view of the optical unit 100 supported by the reticle stage 25.

In FIG. 2, a position of an upper surface of the reticle 20 is shown as an A surface (two-dot chain line), and a position of the bottom surface of the reticle 20 is shown as a B surface (two-dot chain line). The upper surface of the reticle 20 shown as the A surface corresponds with a position of a blank surface in usual reticle 20. The bottom surface of the reticle 20 shown as the B surface corresponds with a position of a pellicle surface attached to the reticle 20 in usual reticle 20.

The optical unit 100 includes plural optical elements. In detail, the optical unit 100 includes a mask having a pinhole 101, a Fourier transformation lens 102, deflecting mirrors 103a and 103b, and a relay optical system 104.

The optical unit 100 is arranged so that the optical unit 100 can automatically convey to (or from) the exposure apparatus 1 (in other words, the optical unit 100 can be supported by the reticle stage 25). In detail, the upper surface of the optical unit 100 is arranged in the position of the almost A surface, and the bottom surface of the optical unit 100 is arranged in the position of the almost B surface. However, if the optical unit 100 can be automatically conveyed to (or from) the exposure apparatus 1, the upper surface may be arranged in a position shifted from the A surface a little and the bottom surface may be arranged in a position shifted from the B surface a little.

A description will be given of a measurement of a polarization optical characteristic (polarization state) of the illumination optical system 18 in a state that the reticle stage 25 supports the optical unit 100. The illumination optical system 18 illuminates, as shown in FIG. 2, a C surface. The C surface optically corresponds with a pattern surface of the reticle 20 in consideration of a thickness of the reticle 20 (glass materials).

The optical unit 100 includes the pinhole 101. The pinhole 101 is preferably located in the C surface. If the pinhole 101 defocuses from the C surface, the light intensity distribution fades in a periphery of the illumination area of the illumination optical system 18. Therefore, if the pinhole 101 defocuses from the C surface, the measurement of the optical characteristic using the optical unit 100 is executed to an area having uniformly light intensity distribution among the illumination area of the illumination optical system. The optical unit 100 can be made compact by defocusing the pinhole 101 from the C surface.

The light that passes the pinhole 101 is changed into almost parallel light by the Fourier transformation lens 102. The light (parallel light) that passes the Fourier transformation lens 102 is reflected (deflected) by the deflecting mirror 103a and forms an image of the effective light source distribution of the illumination optical system 18 on a D surface. The D surface is a pupil surface to the C surface as the image surface.

The image of the effective light source distribution formed on the D surface forms the image of the effective light source distribution on an E surface via the relay optical system 104 and the deflecting mirror 103b. The E surface is an observation surface of the observation optical system 200 described later. The E surface optically corresponds with the pattern surface of the reticle 20 in consideration of the thickness of the reticle 20 like the C surface.

The relay optical system 104 is preferably a telecentric optical system in the incident side (the D surface side) and the exit side (the E surface side). If the relay optical system 104 is the telecentric optical system, an imaging magnification error in the E surface by a tolerance fabrication error, such as the optical element included in the relay optical system 104, can be controlled to the minimum. The structure of the relay optical system 104 is generally known as a beam expander.

The observation optical system 200 as a polarization state measuring part is an optical system that observes the reticle surface. The observation optical system 200 detects a mark for an alignment on the reticle 20 and alignment mark of a standard plate (not shown) on the reticle stage 25, and is used for a relative alignment between the reticle 20 and the reticle stage 25. Moreover, the observation optical system 200 detects the mark for an alignment on the reticle 20 and an alignment mark of a standard plate (not shown) on the wafer stage 45, and is used for a relative alignment between the reticle 20 and the wafer stage 45.

The observation optical system 200 detects (observes), in the instant embodiment, the image of the effective light source distribution formed on the E surface. In detail, the image of the effective light source distribution formed on the E surface enters an objective lens 201 and is changed into a condensed light on a pupil surface in the objective lens 201, in the observation optical system 200. The light (condensed light) that passes the objective lens 201 is reflected (deflected) by a deflecting mirror 202, and is changed into a parallel light via a lens 203. The light (parallel light) that passes the lens 203 forms the image of the effective light source distribution on a G surface. The optical system included in the objective lens 201 and the lens 203 is preferably the telecentric optical system in the incident side (the E surface side) and the exit side (the G surface side) for the same reason as the above relay optical system 104.

A two-dimensional image sensor (CCD etc.) 204 is arranged on the G surface and detects (observes) the image of the effective light source distribution formed by the objective lens 201, the deflecting mirror 202 and the lens 203. A phase shifter (phase plate) 240 and a polarization element 260 that gives the birefringence to a transmitted light are arranged between the lens 203 and the two-dimensional image sensor 204. The phase shifter 240 and the polarization light are arranged in order from the incident side as shown in FIG. 2. Thereby, the polarization measurement becomes possible.

A description will be given of the polarization measurement used for the optical unit 100 and the observation optical system 200. The light intensity distribution detected by the two-dimensional image sensor 204 is a function of three unknown, i.e., amplitudes Ex and Ey and a phase difference δ. Therefore, the polarization state of the incident light can be measured when the light intensity is measured at three or more independent states.

Figure 3:
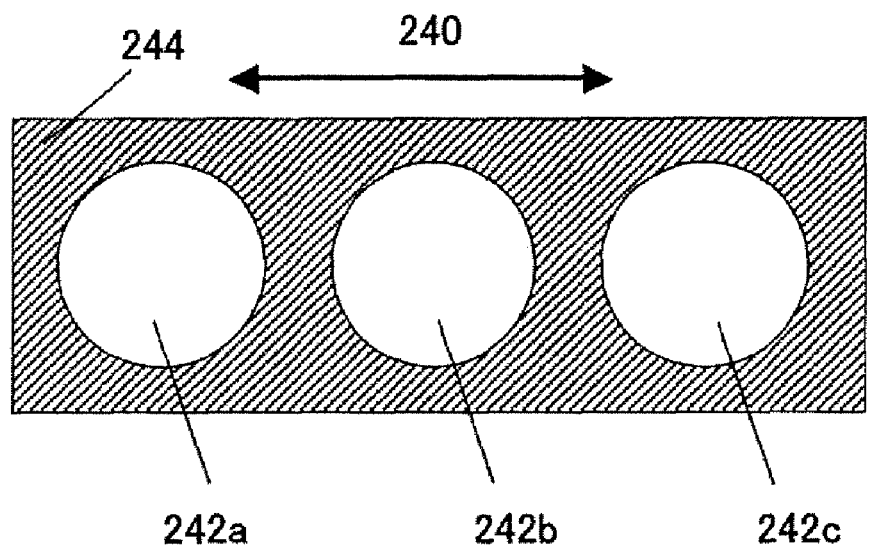
FIG. 3 is a schematic plane view of one example of a phase shifter shown in FIG. 2.

For example, the three or more independent states are created by using a structure of the phase shifter 240 shown in FIG. 3 that has arranged three phase shifters 242a to 242c that gives different phase differences to the transmitted light on a plate 244. The three or more independent states are realized by sliding the plate 244 and changing the phase shifters 242a to 242c arranged on the optical path. Here, FIG. 3 is a schematic plane view of one example of the phase shifter 240.

Figure 4:
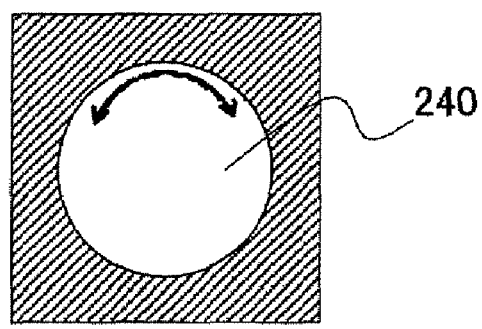
FIG. 4 is a schematic plane view of one example of a phase shifter shown in FIG. 2.

The three or more independent states are realized by using the rotatable phase shifter 240 and changing a rotation angle of the phase shifter 240 to three or more. FIG. 4 is a schematic plane view of one example of the phase shifter 240.

Moreover, the three or more independent states are realized by using the phase shifter 240 that includes two wavelength plates of a λ/2 wavelength plate and a λ/4 wavelength plate and rotating each of the λ/2 wavelength plate and the λ/4 wavelength plate.

In addition, the three or more independent states are realized by using a PEM (photoelastic modulator) as the phase shifter 240. The PEM gives three or more phase differences to the transmitted light by applying three or more stresses. The stress member is resonated and phase-modulated to apply uniformly stress to the member that has a stress birefringence, included in the PEM. The PEM needs to rotate by a predetermined angle (the same direction as an arrow shown in FIG. 4) on the optical path. Therefore, the three or more independent states are realized by maintaining the stress applied to the member to constant and changing the rotation angle of the PEM to three or more.

The polarization element 260 uses a polarizer having a parallel plate form proposed in Japanese Patent No. 3288976, a polarization beam splitter having a parallel plate form that includes the incident angle near a Brewster angle and a prism type polarization beam splitter etc. The polarization element 260 is fixed in the instant embodiment. However, the polarization element 260 may be rotatable.

Figure 5:
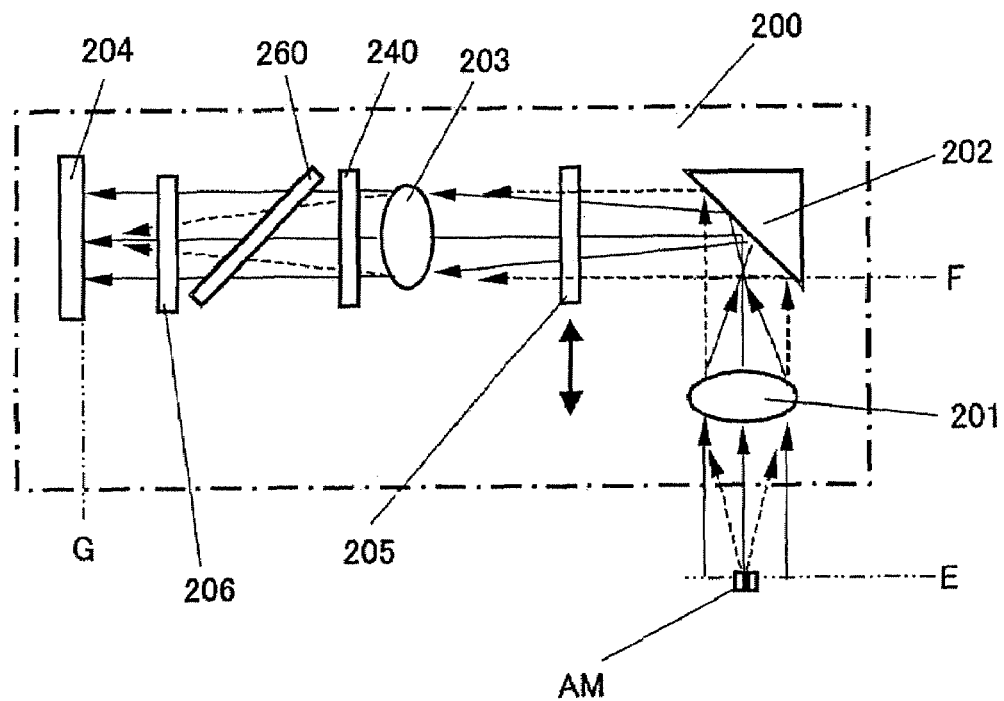
FIG. 5 is a schematic sectional view of one example of an observation optical system shown in FIG. 1.

The phase shifter 240 and the polarization element 260 are preferably arranged on the optical path of the incident light that is changed into the parallel light. The observation optical system 200 in this case is shown in FIG. 5. The observation optical system 200 is used to detect the alignment mark on the reticle 20. A detection (observation) light at this time is shown by a dotted line in FIG. 5. Hereinafter, a description will be given of a passage of the light in the inside of the observation optical system 200 at detecting the alignment mark on the reticle 20.

Referring to FIG. 5, first, an alignment mark AM is illuminated using an illumination light from a light source (not shown) included in the observation optical system 200. The light (detection light) having NA reflected by the alignment mark Am enters the objective lens 201.

The light that passes the objective lens 201 is changed into the almost parallel light, is reflected by the deflecting mirror 202, and enters the lens 203. The light that passes the lens 203 is changed into the condensed light having NA and forms an image of the alignment mark AM on the two-dimensional image sensor 204 via the phase shifter 240 and the polarization element 260.

When detecting the alignment mark AM, the light is almost parallel light between the objective lens 201 and lens 203 including the deflecting mirror 202. On the other hand, when using the optical unit 100, the light is almost parallel light between the E surface and the objective lens 201, and between the lens 203 and the two-dimensional image sensor 204.

The position that the light is changed into the parallel light in detecting the alignment mark AM is different from the position that the light is changed into the parallel light in using the optical unit 100. Therefore, if the optical unit 100 is used, the phase shifter 240 and the polarization element 260 are preferably arranged in a preceding space of the two-dimensional image sensor 204 that the light is changed into the parallel light.

However, the phase shifter 240 and the polarization element 260 can obtain, generally, the good polarization transmission characteristic only in remarkably narrow range of NA (almost several degrees). Therefore, if the phase shifter 240 and the polarization element 260 are fixed to the inside of the observation optical system 200, the polarization transmitted light has an asymmetrical light intensity distribution at detecting the alignment mark AM and the measurement error occurs in the two-dimensional image sensor 204. Then, if the alignment mark Am is detected, a depolarization element 205 may be arranged between the objective lens 201 and the lens 203. Thereby, the light that passes the phase shifter 240 and the polarization element 260 is changed into a unpolarized light, and can pass the phase shifter 240 and the polarization element 260 with the good transmission characteristic. Moreover, the phase shifter 240 and the polarization element 260 may be arranged on the optical path at using the optical unit 100 and the phase shifter 240 and the polarization element 260 may be removed from the optical path at detecting the alignment mark AM.

If plural optical systems are arranged between the polarization element 260 and the two-dimensional image sensor 204, a depolarization element 206 is preferably arranged after the polarization element 260 to remove the influence of the birefringence by the optical systems. The light intensity distribution detected by the two-dimensional image sensor 204 may be the unpolarized light. Moreover, if the detection by the two-dimensional image sensor 204 changes according to the polarization state of the light even if the optical system does not exist between the polarization element 260 and the two-dimensional image sensor 204, the depolarization element 206 may be arranged after the polarization element 260.

If the optical characteristic of the illumination optical system 18 is measured using the optical unit 100 and the observation optical system 200, it is necessary to measure a measurement offset of the optical unit 100 and the observation optical system 200. The measurement offset is a change of the polarization state caused by the optical unit 100 and the observation optical system 200 (measuring system). The change of the polarization state is caused by optical elements included in the optical unit 100 and the observation optical system 200, in other words, a reflectance characteristic of mirror, a characteristic of antireflection coating of lens, a birefringence distribution included in glass materials, and a stress birefringence generated by maintenance of lens etc.

Figure 6:
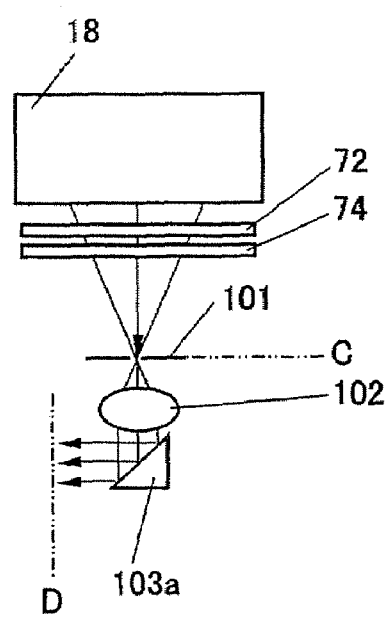
FIG. 6 is a schematic sectional view of an exposure apparatus at measuring a measurement offset in a first embodiment.
Figure 7:
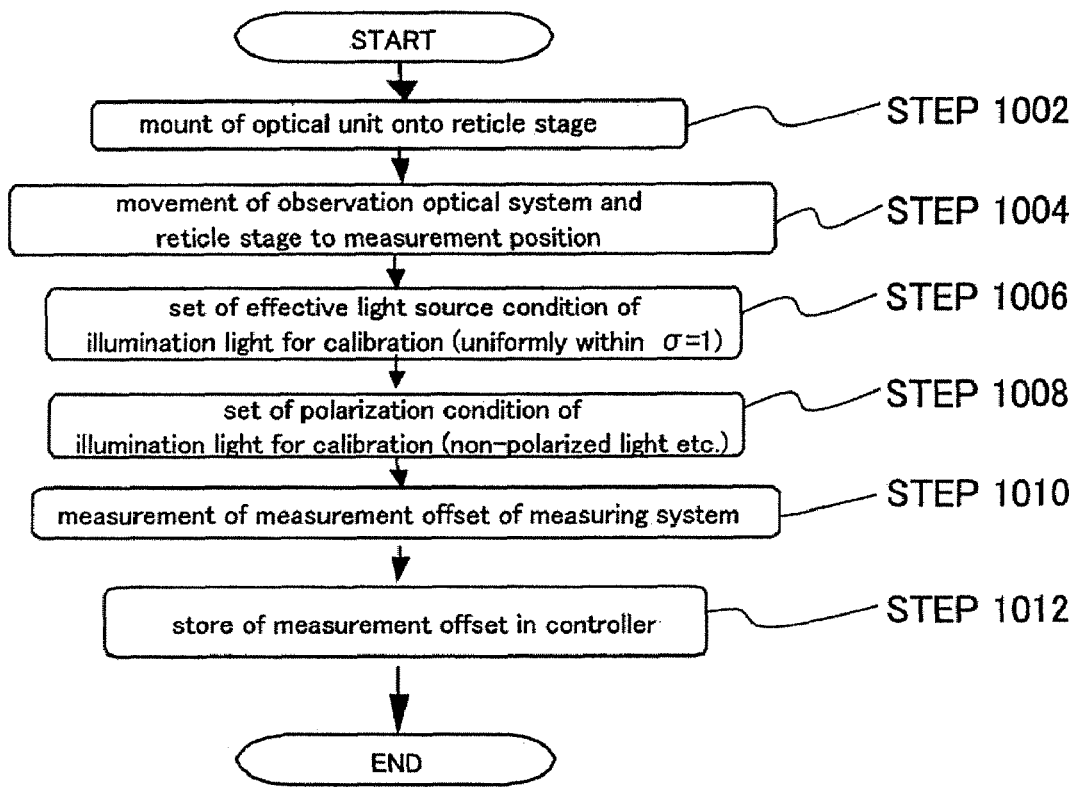
FIG. 7 is a flowchart for explaining a measurement of measurement offset in a first embodiment.

Referring to FIGS. 6 and 7, a description will be given of a measurement of measurement offset. FIG. 6 is a schematic sectional view of the exposure apparatus 1 at measuring a transmittance difference as one of the measurement offset. FIG. 7 is a flowchart for explaining the measurement of measurement offset. Hereinafter, the measuring system is called including the optical unit 100 and the observation optical system 200.

First, the optical unit 100 is mounted on the reticle stage 25 (step 1002), and the reticle stage 25 and the observation optical system 200 are moved to a measurement position (step 1004).

Next, in the illumination optical system 18, the illumination light is set to σ=1 or more and the unpolarized light (random polarized light) (steps 1006 and 1008). The measurement offset of the measuring system is measured by illuminating the pinhole 101 of the optical unit 100 using the light set by steps 1006 and 1008 (step 1010). At this time, the illumination light illuminates the pinhole 101 by uniformly light intensity distribution and the effective light source of the illumination light is uniformly light intensity in at least σ=1 or less. Moreover, a depolarization element 72 and a uniformizer 74 are arranged between the illumination optical system 18 and the optical unit 100 as shown in FIG. 6, and the unpolarized light (random polarized light) state of the illumination light and uniformity of the effective light source distribution is preferably improved.

The light intensity distribution detected by the two-dimensional image sensor 204 should be recognized as constant state irrespective of a state of the phase shifter 240 (rotation, select, etc.). If light intensity distribution detected by the two-dimensional image sensor 204 is different according to the state of the phase shifter 240, the measurement offset is caused. Finally, the light intensity distribution detected by the two-dimensional image sensor 204 is stored, as the measurement offset (correction date of measurement value), in a memory (not shown) of the controller 60 for each state of the phase shifter 240 (step 1012).

The polarization characteristic of only measuring system can be measured by replacing the depolarization element 72 by the polarizer, and can be stored, as the measurement offset, in the memory (not shown) of the controller 60.

The optical characteristic of the illumination optical system 18 is calculated from the light intensity distribution detected by the two-dimensional image sensor 204 using the optical unit 100 and the observation optical system 200 on the reticle stage 25. At this time, the optical characteristic of the illumination optical system 18 is calculated by removing the measurement offset according to the state of the phase shifter 240 measured beforehand from the light intensity distribution detected by the two-dimensional image sensor 204. When the polarization optical characteristic of the illumination optical system 18 is measured, as mentioned above, the polarization optical characteristic is calculated using the light intensity distributions obtained by changing the phase shifter 240 to at least three or more states.

The first embodiment can measure, as the optical characteristic, information of the effective light source distribution of the illumination optical system 18 and the polarization characteristic of this effective light source distribution (phase information and amplitude information).

Second Embodiment

A description will be given of a measurement of optical characteristic of the whole (exposure optical system) of the illumination optical system 18 and the projection optical system 30.

Figure 8:
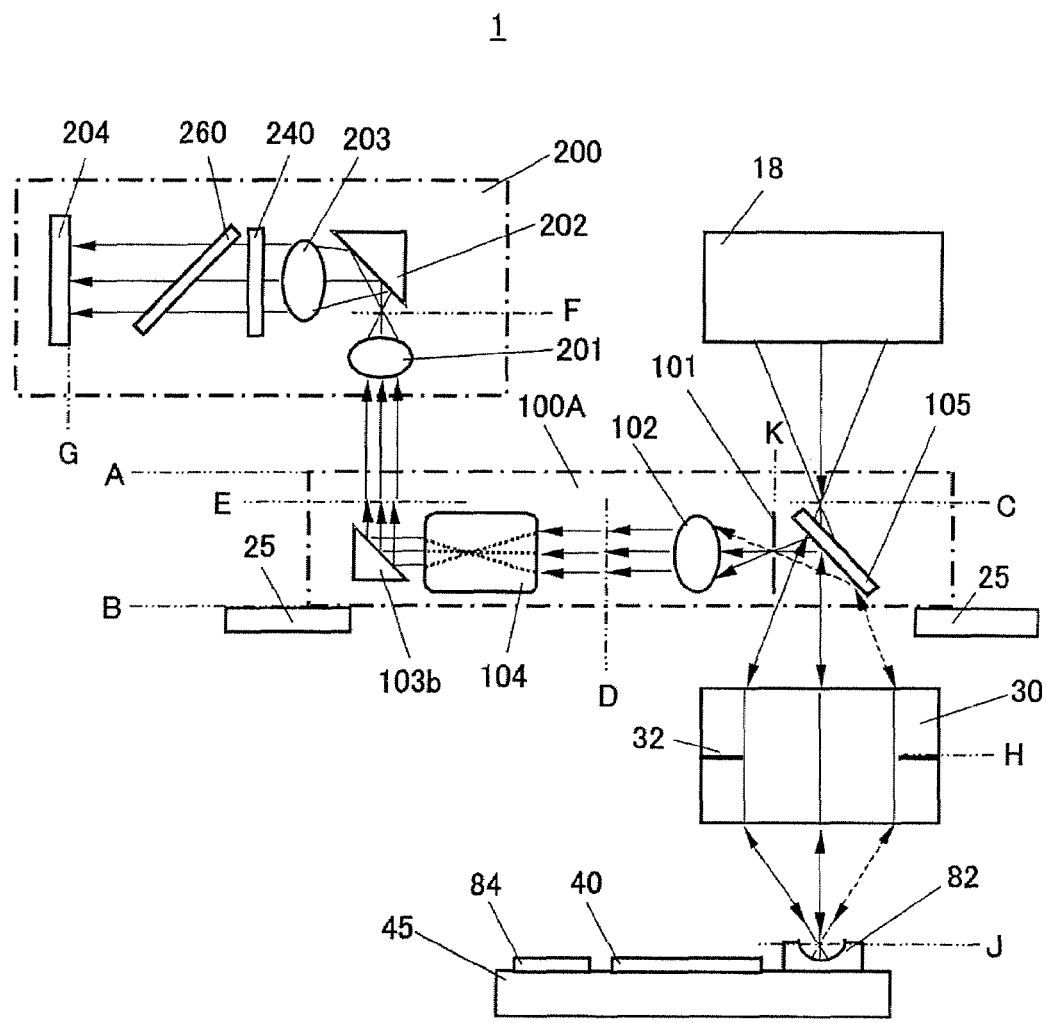
FIG. 8 is a schematic sectional view of an exposure apparatus that has mounted an optical unit used for a measurement of optical characteristics of an exposure optical system on a reticle stage.

The measurement of optical characteristic of the exposure optical system uses, as shown in FIG. 8, an optical unit 100A. The optical unit 100A is different from the optical unit 100 shown in FIG. 2 in that the optical unit 100A includes a half mirror 105 and the pinhole 101 is arranged at a subsequent half mirror 105. Here, FIG. 8 is a schematic sectional view of the exposure apparatus 1 that has mounted the optical unit 100A used for the measurement of optical characteristic of the exposure optical system on the reticle stage 25.

Referring to FIG. 8, the light from the illumination optical system 18 transmits the half mirror 105 and enters the projection optical system 30. An aperture stop 32 is arranged in the projection optical system 30. The aperture stop 32 limits the maximum numerical aperture to guarantee a performance of the projection optical system 30.

The light form the illumination optical system 18 passes the aperture stop 32 and condenses on an image surface J at the wafer stage 45 side. At this time, the illumination light from the illumination optical system 18 preferably has a size more than the numerical aperture of the projection optical system 30 ($\sigma=1$ or more) to measure the optical characteristic of the maximum numerical aperture in the projection optical system 30.

A spherical mirror 82 is provided on the wafer stage 45. When the optical characteristic of the projection optical system 30 is measured, the wafer stage 45 is driven so that a center of curvature of the spherical mirror 82 accords with a condensing point of the light on the image surface J. In other words, the spherical mirror 82 is arranged so that the center of curvature of the spherical mirror 82 accords with the condensing point of the light on the image surface J as shown in FIG. 8.

The light reflected by the spherical mirror 82 passes the same position as a forward path in the projection optical system 30 and returns to the half mirror 105. The light reflected by the half mirror 105 condenses on a K surface optically conjugate with the C surface (a position that optically corresponds the pattern surface of the reicle 20 in consideration of the thickness of the reticle 20). The K surface and the J surface is an optically conjugate.

The pinhole 101 is arranged on the K surface. The light that passes the pinhole 101 forms the image of the effective light source distribution of the illumination optical system 18 and the image of the aperture stop 32 located on a pupil surface H in the projection optical system 30 onto the D surface by the Fourier transformation lens 102. The D surface is the pupil surface to the C surface as the image surface.

A description after the D surface is the same as the first embodiment, and will be omitted.

In the first embodiment, the optical characteristic obtained on the D surface is the optical characteristic of only illumination optical system 18, and the optical characteristic of only illumination optical system 18 is measured. On the other hand, in the second embodiment, the optical characteristic obtained on the D surface is the optical characteristic compounded the illumination optical system 18 and the projection optical system 30. In detail, two optical characteristics of a forward path and a return path in the projection optical system 30 are compounded with the optical characteristic of the illumination optical system 18. Therefore, in the second embodiment, the optical characteristic obtained on the D surface is the optical characteristic of the illumination optical system 18+the optical characteristic of the projection optical system 30+the optical characteristic of the projection optical system 30.

The optical characteristic of the illumination optical system 18 is measured beforehand (first embodiment) and stores in the memory of the controller 60 to separate the optical characteristic of the projection optical system 30 and the optical characteristic of the illumination optical system 18. Thereby, the optical characteristic of the projection optical system 30+the optical characteristic of the projection optical system 30 is the optical characteristic obtained on the D surface/the optical characteristic of the illumination optical system 18, and the optical characteristic of the projection optical system 30 can be measured. However, since the polarization characteristic is expressed with a determinant, it is necessary to be careful of the calculation method.

In the second embodiment, the optical characteristic of the projection optical system 30 is information of a pupil transmittance distribution in the projection optical system 30 and the polarization characteristic of the pupil transmittance distribution (phase information and amplitude information).

Figure 9:
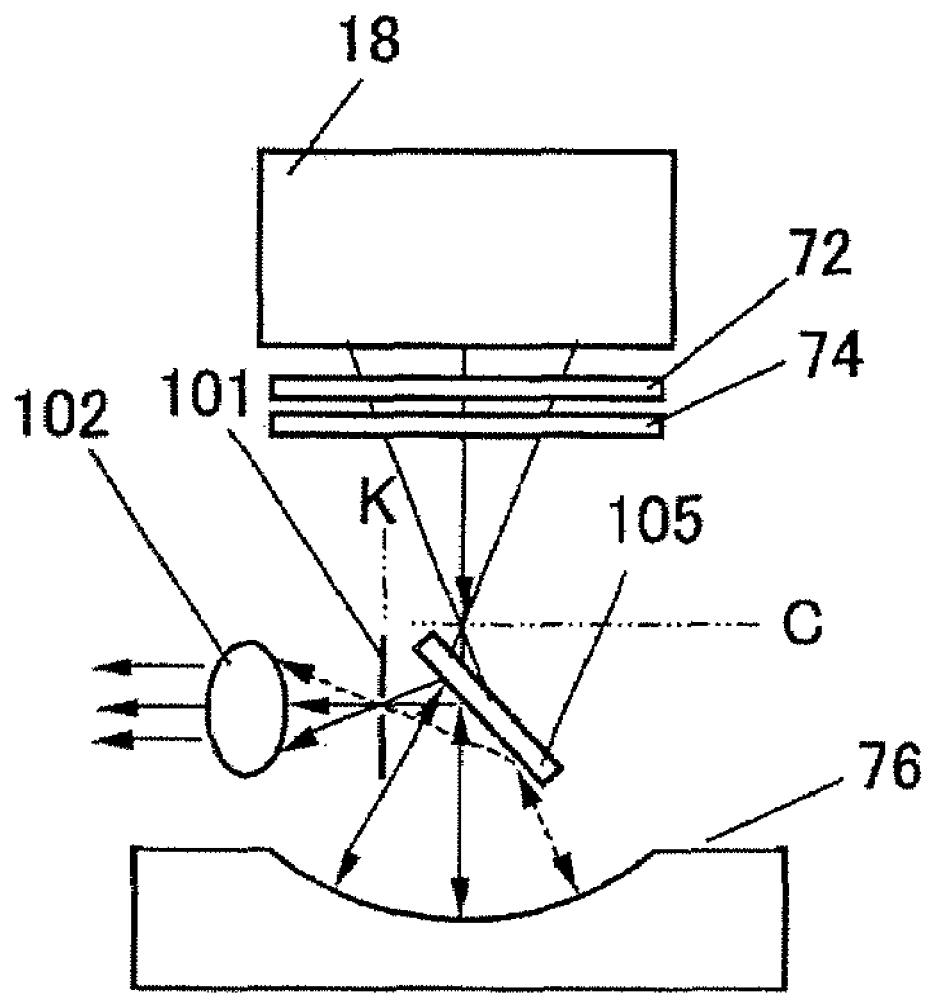
FIG. 9 is a schematic sectional view of an exposure apparatus at measuring a measurement offset in a second embodiment.
Figure 10:
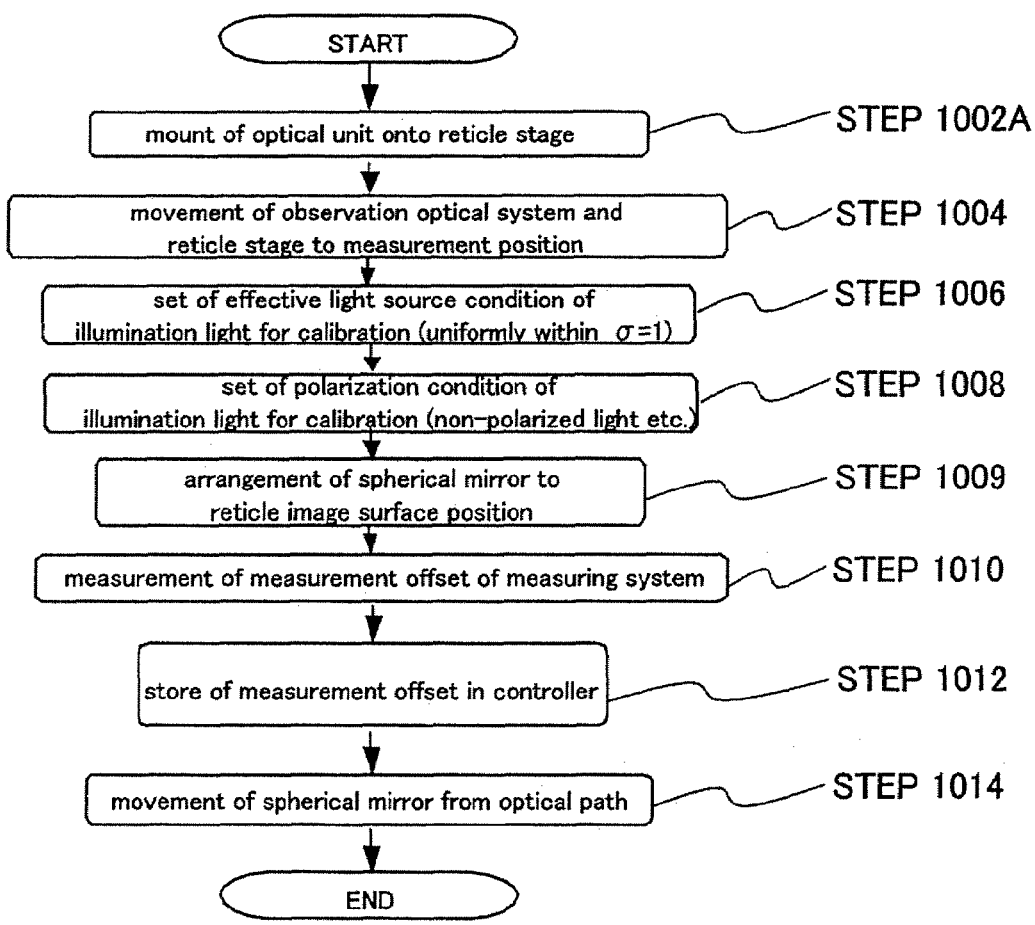
FIG. 10 is a flowchart for explaining a measurement of measurement offset in a second embodiment.

Referring to FIGS. 9 and 10, a description will be given of a measurement of measurement offset in the second embodiment. FIG. 9 is a schematic sectional view of the exposure apparatus 1 at measuring the measurement offset in the second embodiment. FIG. 10 is a flowchart for explaining the measurement of measurement offset in the second embodiment.

First, the optical unit 100A is mounted on the mask stage 25 (step 1002A). A description of steps 1004 to 1008 is the same as the first embodiment, and will be omitted.

Next, a spherical mirror 76 is arranged at a subsequent optical unit 100A (step 1009). At this time, the spherical mirror 76 is arranged so that a center of curvature of the spherical mirror 76 accords with a condensing point of the light in the C surface (the position that optically corresponds the pattern surface of the reicle 20 in consideration of the thickness of the reticle 20). The spherical mirror 76 may be arranged by a user and may be automatically arranged. Moreover, the depolarization element 72 and the uniformizer 74 are arranged between the illumination optical system 18 and the optical unit 10A, and the unpolarized light (random polarized light) state of the illumination light and uniformity of the effective light source distribution is preferably improved.

Next, the measurement offset of the measuring system is measured by illuminating the optical unit 100A using the light set by steps 1006 and 1008 (step 1010). Then, the light intensity distribution detected by the two-dimensional image sensor 204 is stored, as the measurement offset (correction date of measurement value), in a memory (not shown) of the controller 60 for each state of the phase shifter 240 (step 1012). Finally, the spherical mirror 76 is moved from the optical path (step 1014).

The measurement of measurement offset is executed almost one time or two times in one year as a periodical maintenance. However, when the polarization measurement is executed, characteristics of the deflecting mirror 103b, the half mirror 105, the lens 203 and the polarization element 260 changes by moisture absorption and deposition (inorganic, organic), etc., and the measurement offset sensitively causes a variation per hour.

Figure 11:
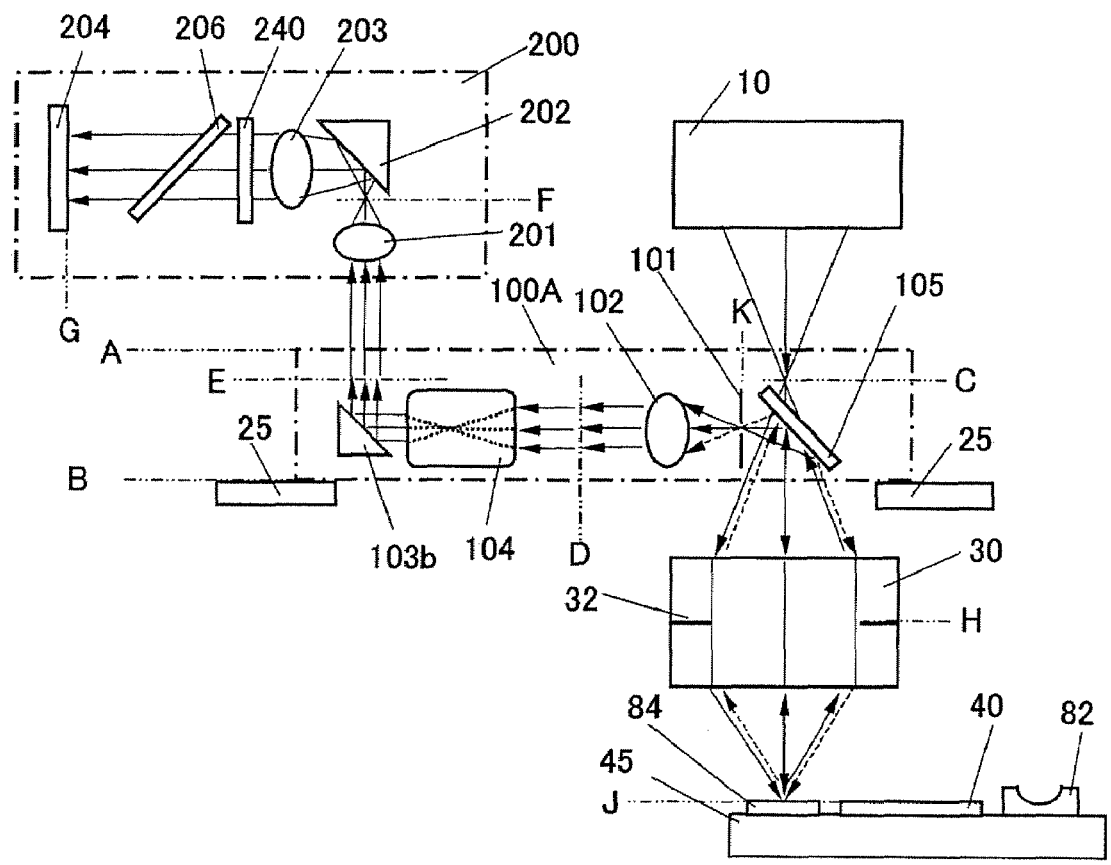
FIG. 11 is a schematic sectional view of an exposure apparatus at separating a variation per hour of measurement offset by a plane mirror.

Then, the spherical mirror 76 is not arranged at the subsequent optical unit 100A, the variation per hour of measurement offset may be calibrated using a plane mirror 84 on the wafer stage 45 as shown in FIG. 11. The plane mirror 84 is arranged so that the plane mirror 84 accords with the image surface J. Here, FIG. 11 is a schematic sectional view of the exposure apparatus 1 at separating the variation per hour of measurement offset by the plane mirror 84.

In a forward path and a return path of a light that transmits the half mirror 105 and reaches the projection optical system 30, as shown by a solid line and a dotted line in FIG. 11, the forward path and the return path interchange after being reflected by the plane mirror 84 and the forward path accords with the return path in only central light. Therefore, in the measurement using the plane mirror 84, the optical characteristic of the projection optical system 30 is measured as one symmetrical with a center.

In the measurement using the plane mirror 84, if an asymmetrical component remains in the light intensity distribution detected by the two-dimensional image sensor 204 even if the measurement offset measured beforehand is removed, the asymmetrical component is a component caused by the variation per hour. A value added this asymmetrical component to the measurement offset measured beforehand is considered as new measurement offset of the measuring system.

The measurement of the asymmetrical component using the plane mirror 84 can be executed in a state that the reticle stage 25 supports the optical unit 100A by arranging the plane mirror 84 on the wafer stage 45.

Figure 12:
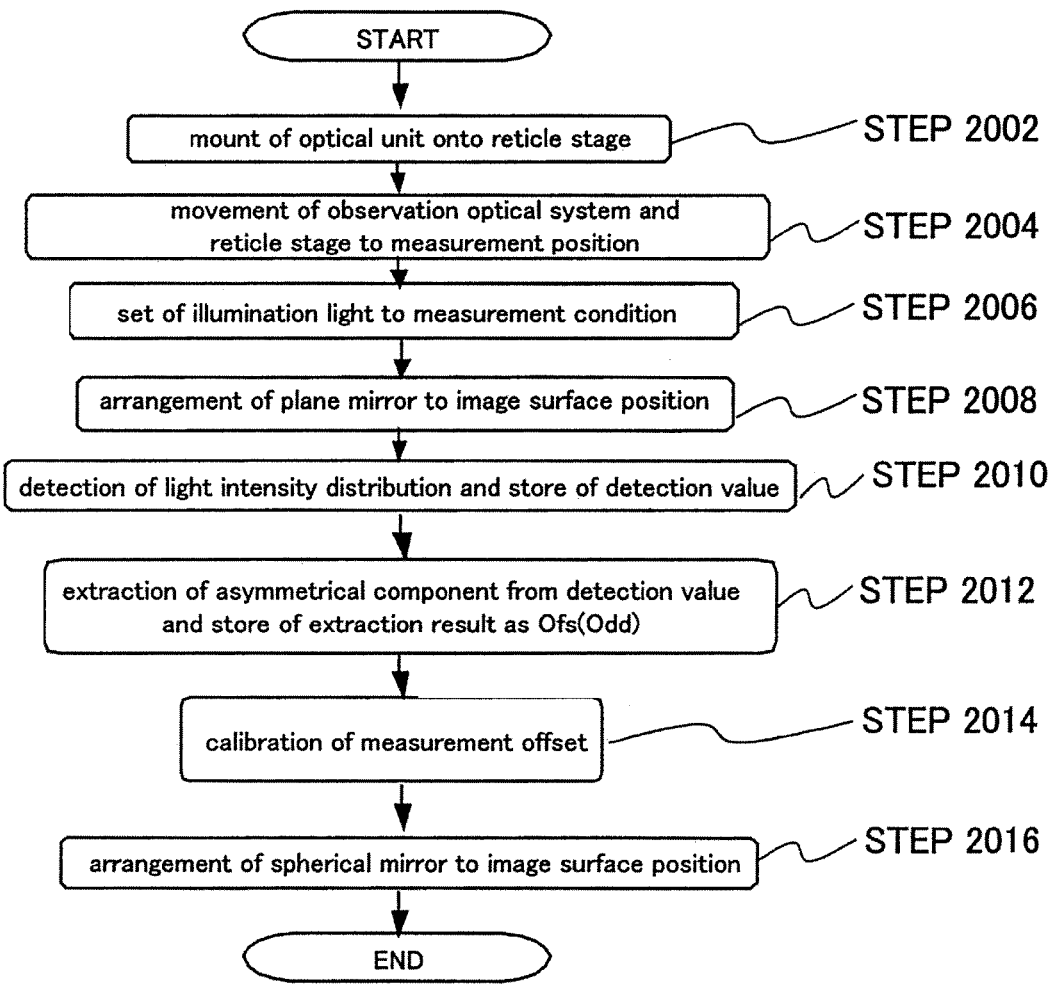
FIG. 12 is a flowchart for explaining a calibration of variation per hour of measurement offset.

FIG. 12 is a flowchart for explaining a calibration of variation per hour of measurement offset. The measurement offset is beforehand stored as a measurement offset Ofs using the spherical mirror 76.

First, the optical unit 100A is mounted on the mask stage 25 (step 2002), and the reticle stage 25 and the observation optical system 200 is moved to a measurement position (step 2004).

Next, in the illumination optical system 18, the illumination light is set to a measurement condition (for example, σ=1 or more and unpolarized light (random polarized light)) (step 2006). Then, the plane mirror 84 is arranged at the position of the image surface J by driving the wafer stage 45 (step 2008).

In the state that the plane mirror 84 is arranged at the position of the image surface J, the light intensity distribution is detected by the two-dimensional image sensor 204 using the illumination light set by step 2006 and a detection value is stored in the memory of the controller 60 (step 2010). Moreover, only the asymmetrical component is extracted from the detection value and an extraction result is stored in the memory of the controller 60 as Ofs (Odd) (step 2012).

Next, the measurement offset measured beforehand is calibrated using the extraction result stored by step 2012 (step 2014). Concretely, the measurement offset is calibrated from the measurement offset Ofs to the measurement offset Ofs-Ofs (Odd). Then, the spherical mirror 82 is arranged so that the center of curvature of the spherical mirror 82 accords with the condensing point of the light on the image surface J (step 2016), and the optical characteristic of the exposure optical system is measured using the measurement offset Ofs-Ofs (Odd).

In the second embodiment, the two-dimensional image sensor 204 can detect the image of the effective light source of the illumination optical system 18 and the image of the aperture stop 32 of the projection optical system 30. Therefore, a telecentricty of the exposure optical system is measured and the telecentricty can be adjusted based on this measurement result.

In detail, first, the optical unit 100A is mounted on the mask stage 25, and the spherical mirror 82 is arranged at a predetermined position. Next, in the illumination optical system 18, the illumination light is set to σ=1 or more, and an inner diameter center is obtained from the image of the aperture stop 32 of the projection optical system 30 detected by the two-dimensional image sensor 204. Moreover, in the illumination optical system 18, σ is set to a predetermined condition, and a center of gravity of the light intensity distribution is obtained from the image of the effective light source of the illumination optical system 18 detected by the two-dimensional image sensor 204. Next, a difference between the inner diameter center of the image of the aperture stop 32 and the center of gravity of the light intensity distribution of the image of the effective light source. This difference value is obtained in plural positions on on-axis and off-axis of the projection optical system 30. Then, the telecentricty is adjusted using an adjusting mechanism of the telecentricty (not shown) included in the illumination optical system 18 so that this difference value becomes the minimum. In addition, a size of NA, a distortion of NA and a NA difference between on-axis and off-axis etc. can be obtained by obtaining an inner of the aperture stop 32 in on-axis and off-axis of the projection optical system 30.

Third Embodiment

Figure 13:
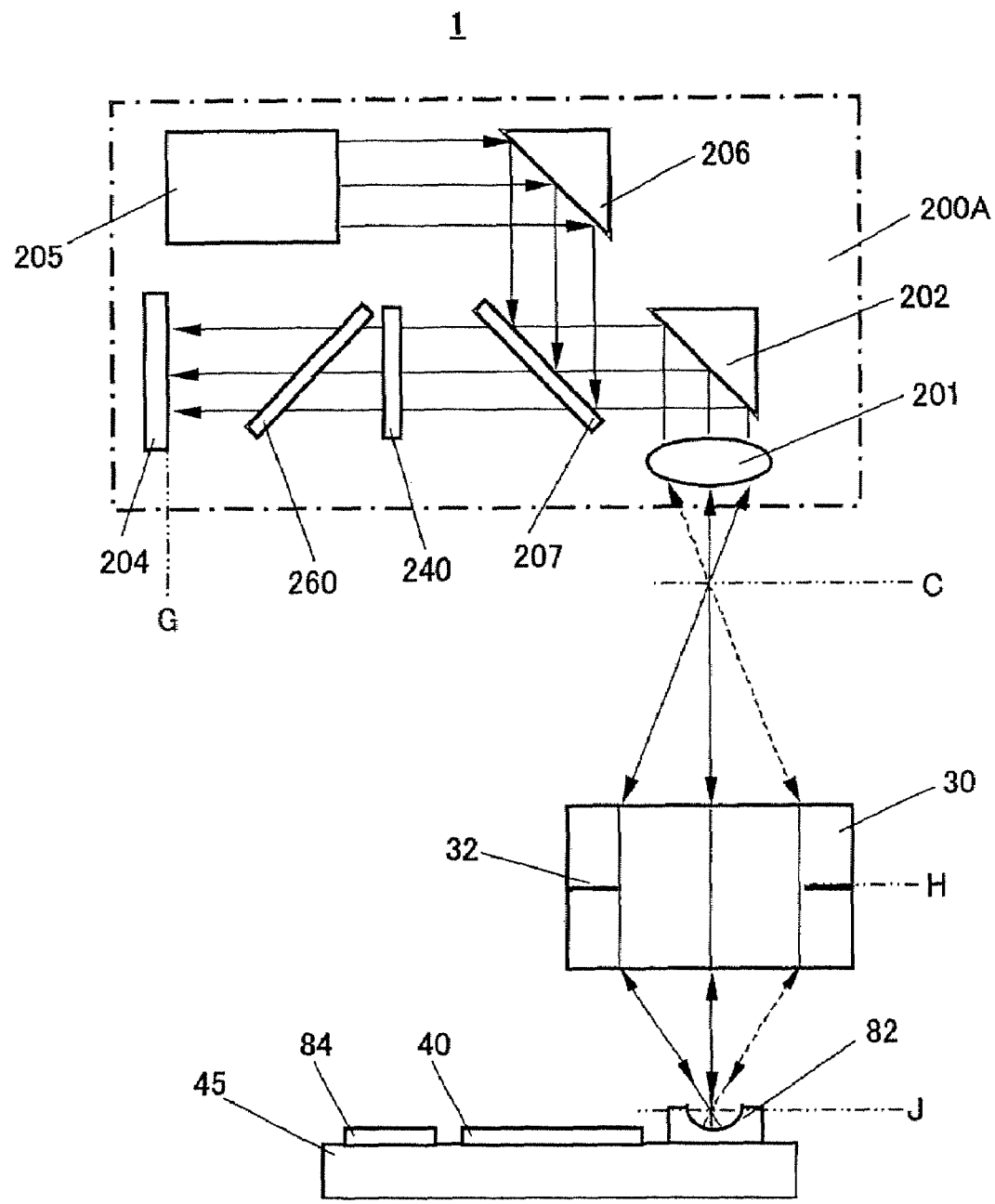
FIG. 13 is schematic sectional view of a dedicated observation optical system used for a measurement of optical characteristics of an exposure optical system.

FIG. 13 is a schematic sectional view of an observation optical system 200A as the polarization state measuring part that is used only for the measurement of optical characteristic of the whole of the illumination optical system 18 and the projection optical system 30 (exposure optical system). The observation optical system 200A can measure the optical characteristic of the projection optical system 30 without using the optical unit 100A.

The observation optical system 200A is different from the observation optical system 200 in that the observation optical system 200A further includes a light source 205 for detection (observation), a deflecting mirror 206, a half mirror 207. The light from the light source 205 is reflected by the deflecting mirror 206. The light reflected by the deflecting mirror 206 is reflected by the half mirror 207 and the deflecting mirror 206 and enters the objective lens 201.

The light from the light source 205 enters the objective lens 201 as almost parallel light, and condenses on the C surface (the position that optically corresponds the pattern surface of the reicle 20 in consideration of the thickness of the reticle 20). The C surface includes a pinhole (not shown). This pinhole may be a pinhole patterned on the reticle surface and a metal board having an opening. The light that passes the C surface reaches the spherical mirror 82 on the wafer stage 45 via the projection optical system 30, and is reflected by the spherical mirror 82. A description until the light reflected by the spherical mirror 82 returns to the C surface is the same as the second embodiment (FIG. 8), and will be omitted.

The light returned to the C surface passes the objective lens 201 as the Fourier transform lens, and forms the image of the aperture stop 32 located on the pupil surface H in the projection optical system 30, on the two-dimensional image sensor 204 arranged at a G surface. The G surface is a pupil surface to the C surface as the image surface. A description except the transmission of the light in the half mirror 207 is the same as the first embodiment, and will be omitted.

In the third embodiment, the optical characteristic of the projection optical system 30 is information of the pupil transmittance distribution in the projection optical system 30 and the polarization characteristic of the pupil transmittance distribution (phase information and amplitude information). Moreover, as in the second embodiment, the size of NA, the distortion of NA and the NA difference between on-axis and off-axis etc. can be obtained by obtaining the inner of the aperture stop 32 in on-axis and off-axis of the projection optical system 30.

Figure 14:
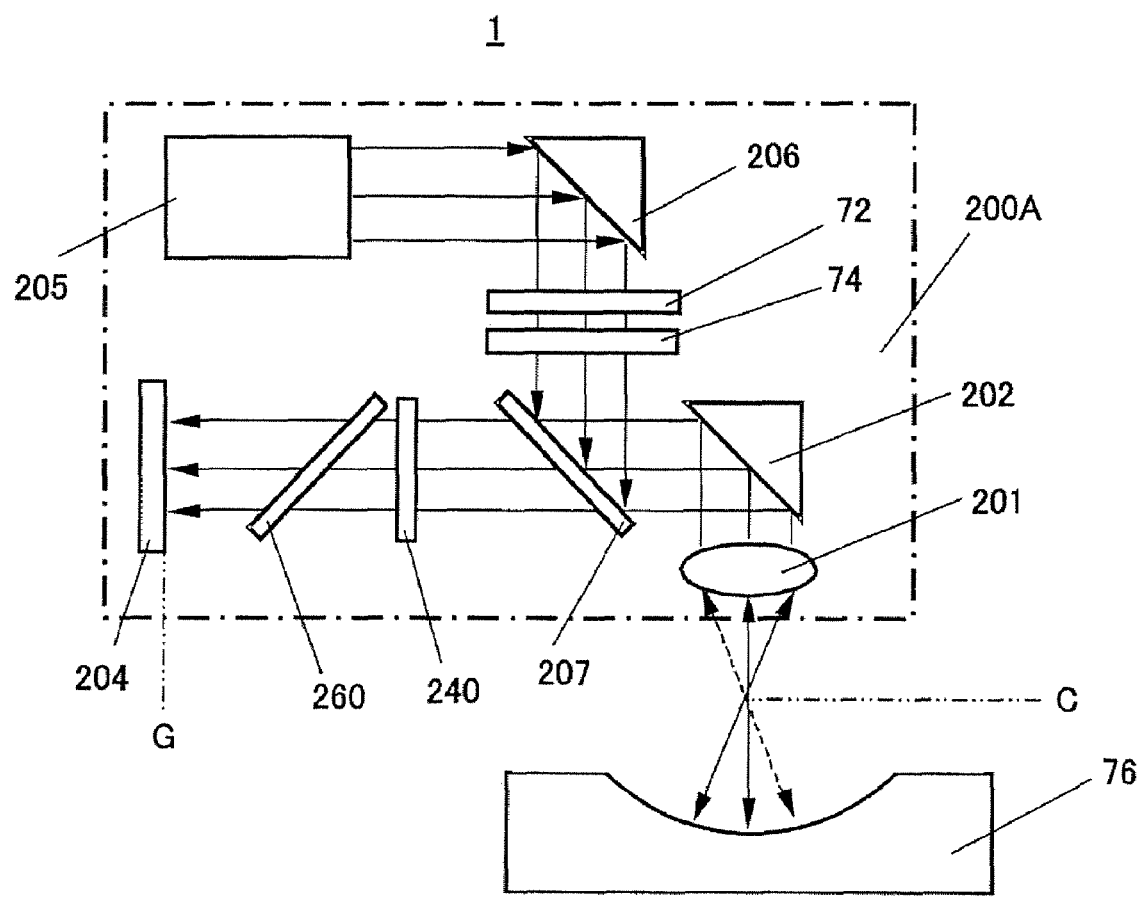
FIG. 14 is a schematic sectional view of an exposure apparatus at measuring a measurement offset in a third embodiment.

FIG. 14 is a schematic sectional view of the exposure apparatus 1 at measuring the measurement offset in the third embodiment. When the measurement offset is measured, the spherical mirror 76 is arranged at the C surface as in the second embodiment (FIG. 9). The third embodiment arranges the depolarization element 72 and the uniformizer 74 in the observation optical system 200A. The depolarization element 72 and the uniformizer 74 are arranged at except a measurement optical path (the optical path that the light returned from the C surface passes).

The third embodiment can calibrate the variation per hour of the measurement offset using the plane mirror 84 as explained in the second embodiment referring to FIG. 11.

Fourth Embodiment

Figure 15:
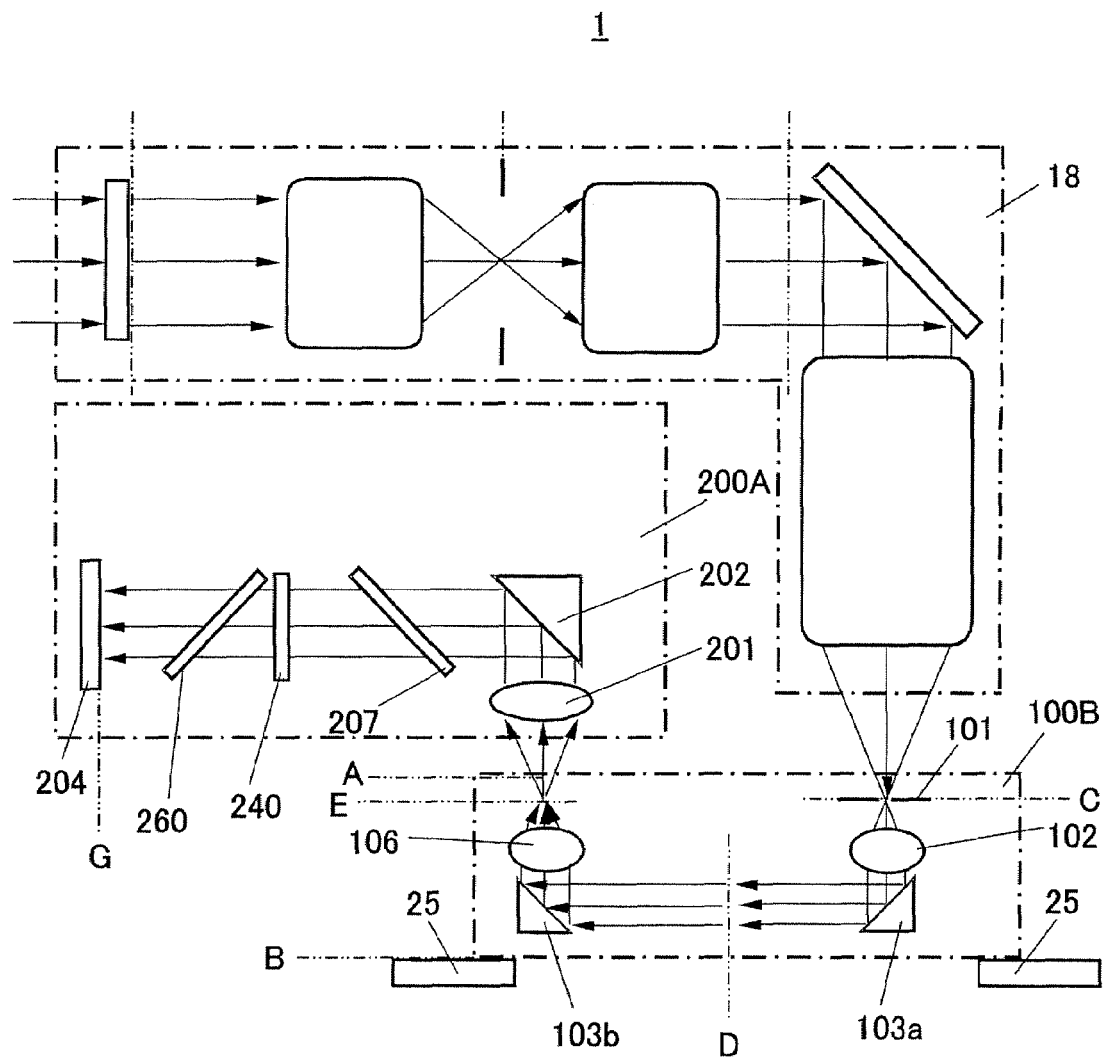
FIG. 15 is a schematic sectional view of a dedicated optical unit used for a measurement of optical characteristics of an exposure optical system.

FIG. 15 is a schematic sectional view of an optical unit 100B that is used only for the measurement of optical characteristic of the whole of the illumination optical system 18 and the projection optical system 30 (exposure optical system). The optical unit 200B is different from the optical unit 100 shown in FIG. 2 in the structure of the optical element. The optical unit 100B includes a component that is used only for the observation optical system 200A. Concretely, the optical unit 100B does not include the relay optical system 104 but includes a Fourier transform lens 106.

Referring to FIG. 15, the illumination light from the illumination optical system 18 illuminates the pinhole 101. The light that passes the pinhole 101 is changed into almost parallel light by the Fourier transform lens 106. The light that passes the Fourier transform lens 106 is reflected (deflected) by the deflecting mirror 103a, and forms the image of the effective light source distribution of the illumination optical system 18 on the D surface. The D surface is a pupil surface to the C surface as the image surface.

The image of the effective light source formed on the D surface is reflected (deflected) by the deflecting mirror 103b, and condenses on the E surface via the Fourier transform lens 106. A description after the E surface is the same as the third embodiment (FIG. 13), and will be omitted. Moreover, a description of the measurement of measurement offset is the same as the first embodiment (FIG. 6), and will be omitted.

Fifth Embodiment

In the illumination optical system 18, an optical characteristic of a subsequent optical system from a final fly-eye lens as a secondary light source greatly influences an image performance of the pattern transfer.

Figure 16:
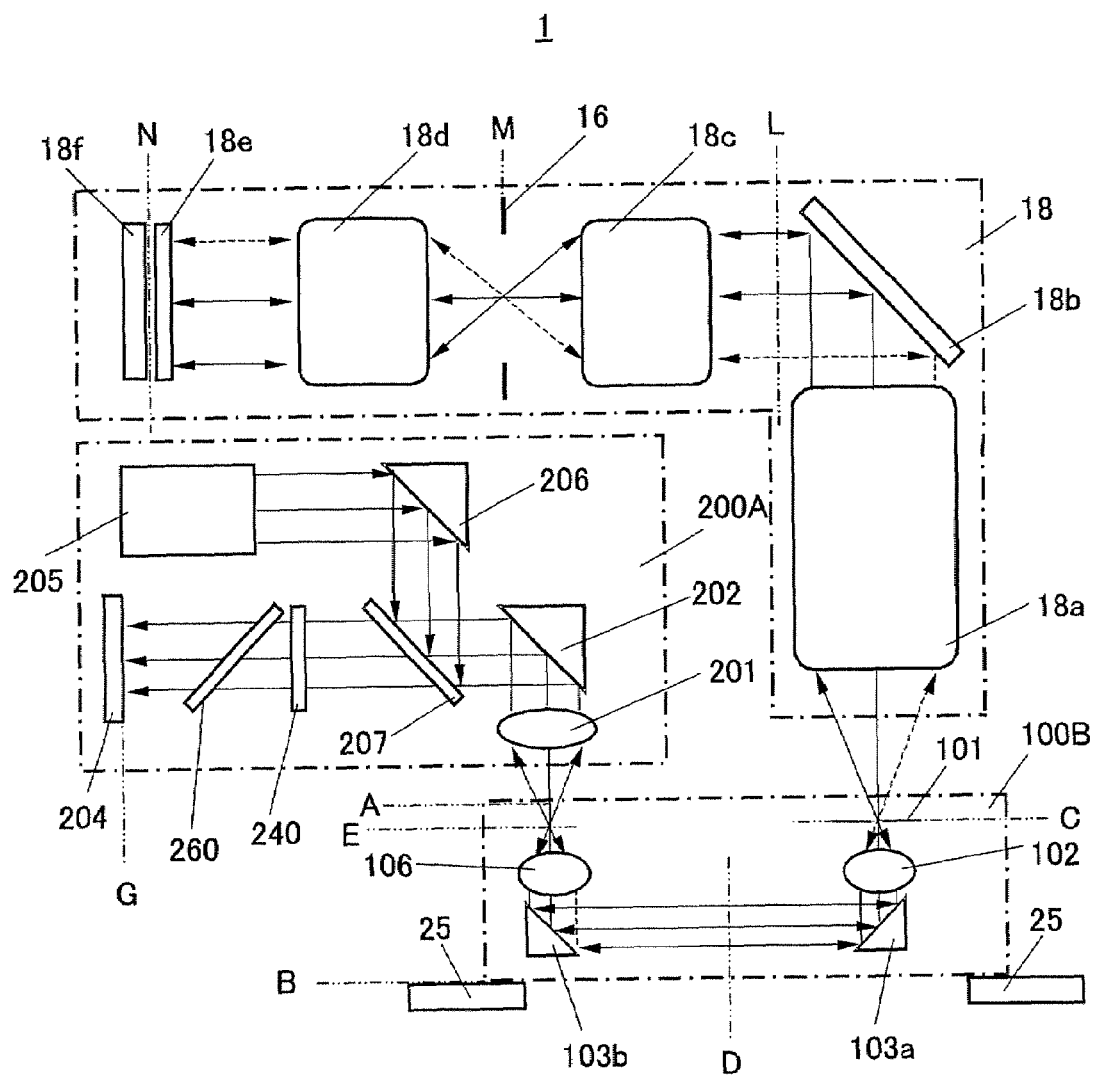
FIG. 16 is a schematic sectional view of an exposure apparatus that includes a dedicated optical unit and observation optical system used for a measurement of optical characteristics of an exposure optical system.

Referring to FIG. 16, a description will be given of a measurement of optical characteristic of the illumination optical system 18 using the observation optical system 200A that is used only for the measurement of optical characteristic of the whole of the illumination optical system 18 and the projection optical system 30 (exposure optical system). The fifth embodiment is different from the fourth embodiment in that the fifth embodiment uses a light source 205 for detection (observation) of the observation optical system 200A. Here, FIG. 16 is a schematic sectional view of the exposure apparatus 1 that includes the optical unit 100B and the observation optical system 200A that are only for the measurement of optical characteristic of the whole of the illumination optical system 18 and the projection optical system 30 (exposure optical system).

Referring to FIG. 16, the light from the light source 205 of the observation optical system 200A enters the optical unit 100B from the observation optical system 200A, and illuminates the pinhole 101 (from an lower in FIG. 16). The light that passes the pinhole 101 enters a masking optical system (back group) 18a of the illumination optical system 18.

The light from the masking optical system (back group) 18a is reflected (deflected) by a deflecting mirror 18b, and enters a masking optical system (front group) 18c. The light that passes the masking optical system (front group) 18c enters a collimator optical system 18d through an opening part of the masking blade 16.

Here, a description will be given of an optically conjugate surface in the illumination optical system 18. A L surface is a pupil surface of the C surface (the position that optically corresponds the pattern surface of the reicle 20 in consideration of the thickness of the reticle 20). The L surface and a N surface are optically conjugate surface with each other. The N surface accords with an exit surface of a fly-eye lens 18f. A M surface is an optically conjugate surface to the C surface (the position that optically corresponds the pattern surface of the reicle 20 in consideration of the thickness of the reticle 20). The masking blade 16 is arranged at the M surface.

The light from the collimator optical system 18d is reflected by a plane mirror 18e arranged near the exit surface (N surface) of the fly-eye lens 18f, passes the same return path as the forward path, returns to the pinhole 101, and condenses.

The light returned to the pinhole 101 returns to the observation optical system 200A via the optical unit 100B, and forms the image of the pupil surface L (conjugate with the N surface) in the illumination optical system 18 on the two-dimensional image sensor 204. The G surface is a pupil surface to the E surface.

As in the projection optical system 30 in the second embodiment (FIG. 8) and the third embodiment (FIG. 13), information of a pupil transmittance distribution in the illumination optical system 18 and the polarization characteristic of the pupil transmittance distribution (phase information and amplitude information) can be measured.

Moreover, if the illumination optical system 18 includes an aperture stop (not shown), a size of NA, a distortion of NA and a NA difference between on-axis and off-axis etc. can be obtained by obtaining an inner of the aperture stop in on-axis and off-axis of the illumination optical system 18.

In a position that the plane mirror 18e is arranged, the aperture stop that changes an effective light source form of the illumination optical system is usually arranged on a turret. Therefore, if the plane mirror 18e is arranged on one of the turret, the measurement in the fifth embodiment can be automatically executed.

Figure 17:
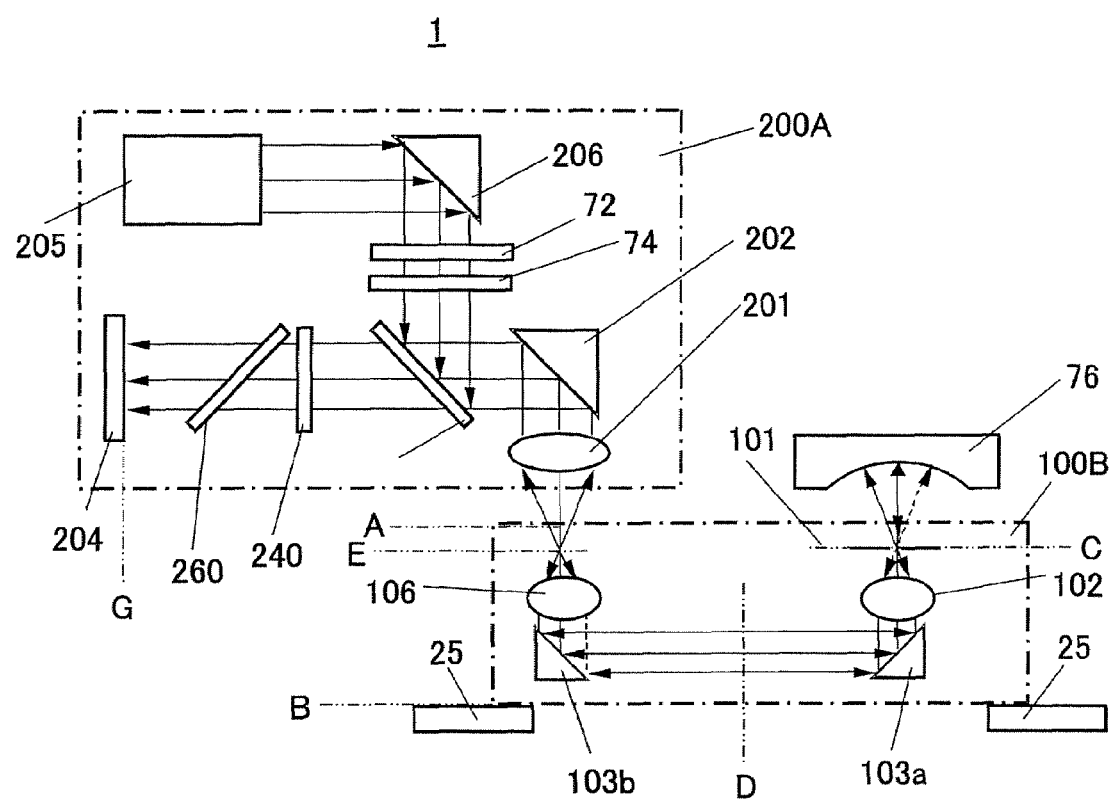
FIG. 17 is a schematic sectional view of an exposure apparatus at measuring a measurement offset in a fifth embodiment.

FIG. 17 is a schematic sectional view of the exposure apparatus 1 at measuring the measurement offset in the fifth embodiment.

The spherical mirror 76 is arranged at the C surface as in the second embodiment (FIG. 9). However, the fifth embodiment reverses the spherical mirror 76 in a vertical direction. The depolarization element 72 and the uniformizer 74 are arranged in the observation optical system 200A as in the third embodiment (FIG. 14). A description of the measurement of measurement offset is the same as the second embodiment (FIG. 9) and the third embodiment (FIG. 14), and will be omitted.

Sixth Embodiment

The sixth embodiment partially exchanges only deteriorated optical element if a deterioration of the optical element occurs in the illumination apparatus 10. In the projection optical system 30, if the optical element is partially exchanged, the imaging performance changes. Therefore, the whole projection optical system 30 is generally exchanged.

Figure 18:
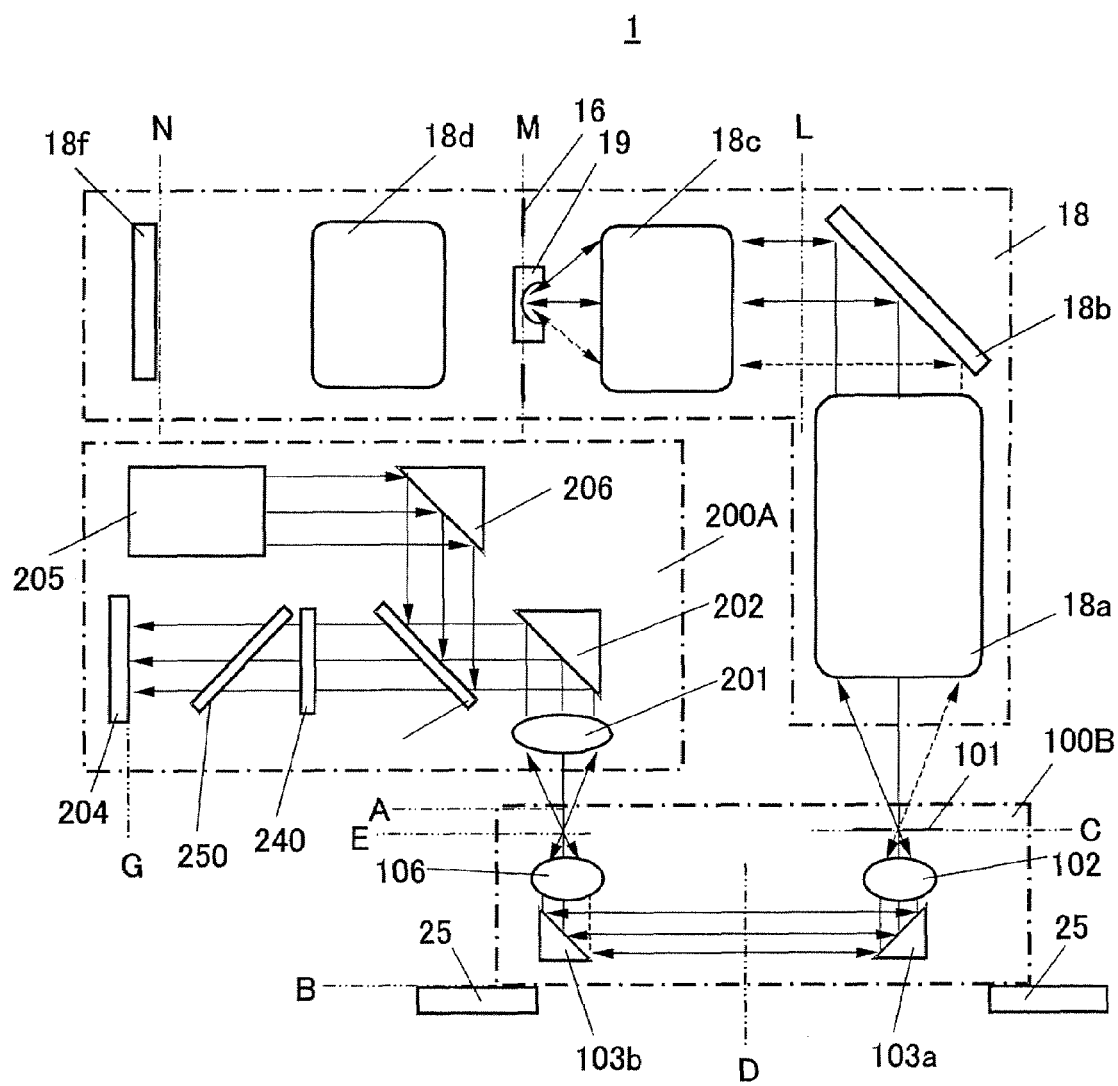
FIG. 18 is a view for explaining a measurement that partially divides an optical characteristics of an illumination optical system and measures it.
Figure 19:
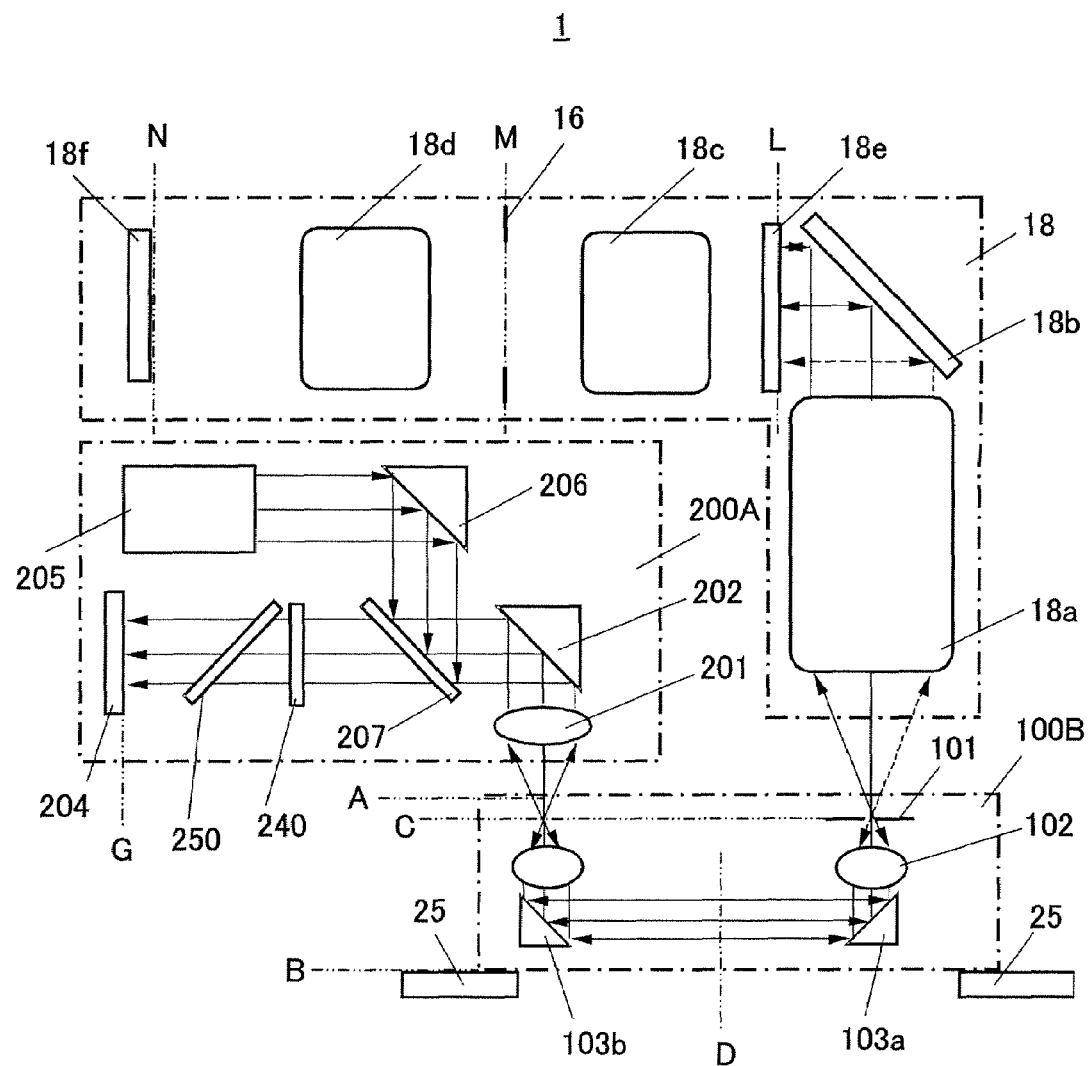
FIG. 19 is a view for explaining a measurement that partially divides an optical characteristics of an illumination optical system and measures it.

FIGS. 18 and 19 are views for explaining a measurement that partially divides the optical characteristic of the illumination optical system 18 and measures it. In FIG. 18, information of the pupil transmittance distribution of the masking optical system (front group) 18c, the deflecting mirror 18b and the masking optical system (back group) 18a and the polarization characteristic of the pupil transmittance distribution (phase information and amplitude information) is measured. FIG. 18 is different from FIG. 16 in that a spherical mirror 19 is arranged at the M surface that optically conjugates with the C surface (the position that optically corresponds the pattern surface of the reicle 20 in consideration of the thickness of the reticle 20).

In FIG. 18, it is judged that the deterioration of the asymmetrical component in the optical characteristic is caused by the deflecting mirror 18b. Moreover, it is judged that the deterioration of the symmetric component in the optical characteristic is caused by the masking optical system (front group) 18c and the masking optical system (back group) 18a. The exchanged optical element (in other words, the deteriorated optical element) is determined based on such judgment.

In FIG. 19, information of the pupil transmittance distribution of the deflecting mirror 18b and the masking optical system (back group) 18a, and the polarization characteristic of the pupil transmittance distribution (phase information and amplitude information) is measured. FIG. 19 is different from FIG. 16 in that a plane mirror 18e is arranged at the L surface as the pupil surface to the C surface (the position that optically corresponds the pattern surface of the reicle 20 in consideration of the thickness of the reticle 20).

In FIG. 19, it is judged that the deterioration of the asymmetrical component in the optical characteristic is caused by the deflecting mirror 18b. Moreover, it is judged that the deterioration of the symmetric component in the optical characteristic is caused by the masking optical system (back group) 18a. The exchanged optical element (in other words, the deteriorated optical element) is determined based on such judgment.

If the sixth embodiment (in other words, the measurement shown in FIGS. 18 and 19) and the fifth embodiment (the measurement shown in FIG. 16) are executed, it can judge whether which portion of a subsequent optical system from the fly-eye lens 18f should be exchanged. Here, the subsequent optical system from the fly-eye lens 18f is the collimator optical system 18d, the masking optical system (front group) 18c, the deflecting mirror 18b, and the masking optical system (back group) 18a.

Seventh Embodiment

Figure 20:
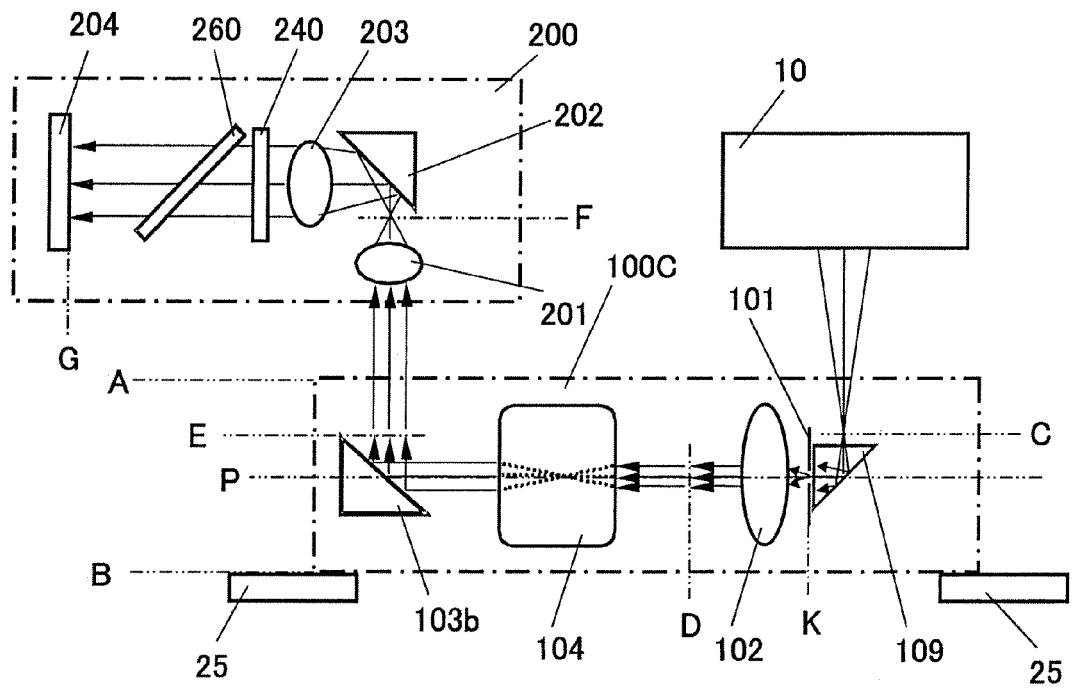
FIG. 20 is a schematic sectional view of an optical unit that can decrease a change of birefringence caused by a stress distortion at maintaining an optical element.

A description will be given of an optical unit 100C that can decrease a change of birefringence caused by a stress distortion at maintaining the optical element. FIG. 20 is a schematic sectional view of the optical unit 100C.

The optical unit 100C in the seventh embodiment (FIG. 20) is an optical unit that improves the optical unit 100 in the first embodiment (FIG. 2). The optical unit 100C provides a P surface that an optical axis of the Fourier transform lens 102 and the relay optical system 104 in an intermediate position between the upper surface of the reicle (A surface) and the bottom surface of the reticle (B surface). Moreover, the optical unit 100C is arranged so that a diameter of the Fourier transform lens 102 and the relay optical system 104 becomes maximum.

The inventor discovered that an influence of the stress birefringence by a retainer (not shown) reaches an area of about 10% of lens outside from a contact position of the lens.

In FIG. 20, the Fourier transform lens 102 and the relay optical system 104 can secure a lens diameter of at least 10 mm, and an area that the influence of the stress birefringence is about 2 mm of one side from the outside. Therefore, in FIG. 20, if a diameter that light passes in the lens is below the half of lens outside (6 mm or less), the light (transmitted light) does not receive the influence of the stress birefringence.

Figure 21:
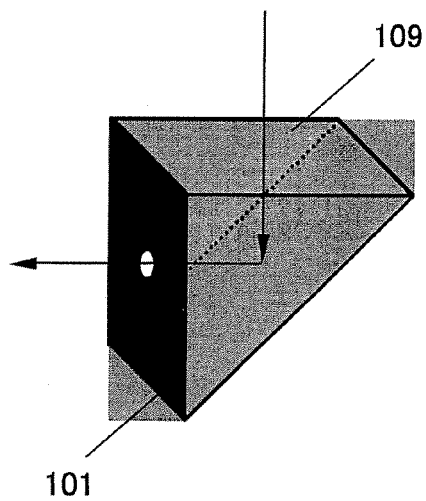
FIG. 21 is a schematic perspective view of an internal reflection type mirror shown in FIG. 20.

Then, an internal reflection type mirror 109 that includes the pinhole 101 on a surface is used as shown in FIG. 21. The internal reflection type mirror 109 total-reflects the light by an inner surface of a plane that inclines by 45 degrees. In the internal reflection type mirror 109, chromium is evaporated on an exit surface and pinhole 101 is formed by etching. Therefore, the internal reflection type mirror 109 has two functions, the mirror and pinhole. Here, FIG. 21 is a schematic perspective view of the internal reflection type mirror 109.

In the seventh embodiment (FIG. 20), an incident surface of the internal reflection type mirror 109 is arranged at near the C surface (the position that optically corresponds the pattern surface of the reicle 20 in consideration of the thickness of the reticle 20). Moreover, a position of the pinhole 109 formed on the internal reflection type mirror 109 is arranged at the K surface that defocuses from the C surface. Thereby, the K surface as the position of the pinhole 101 can be closed to the Fourier transform lens 102, and an enlargement of the lens diameter can be prevented. The pinhole 101 may be configured apart from the internal reflection type mirror 109.

Eighth Embodiment

Figure 22:
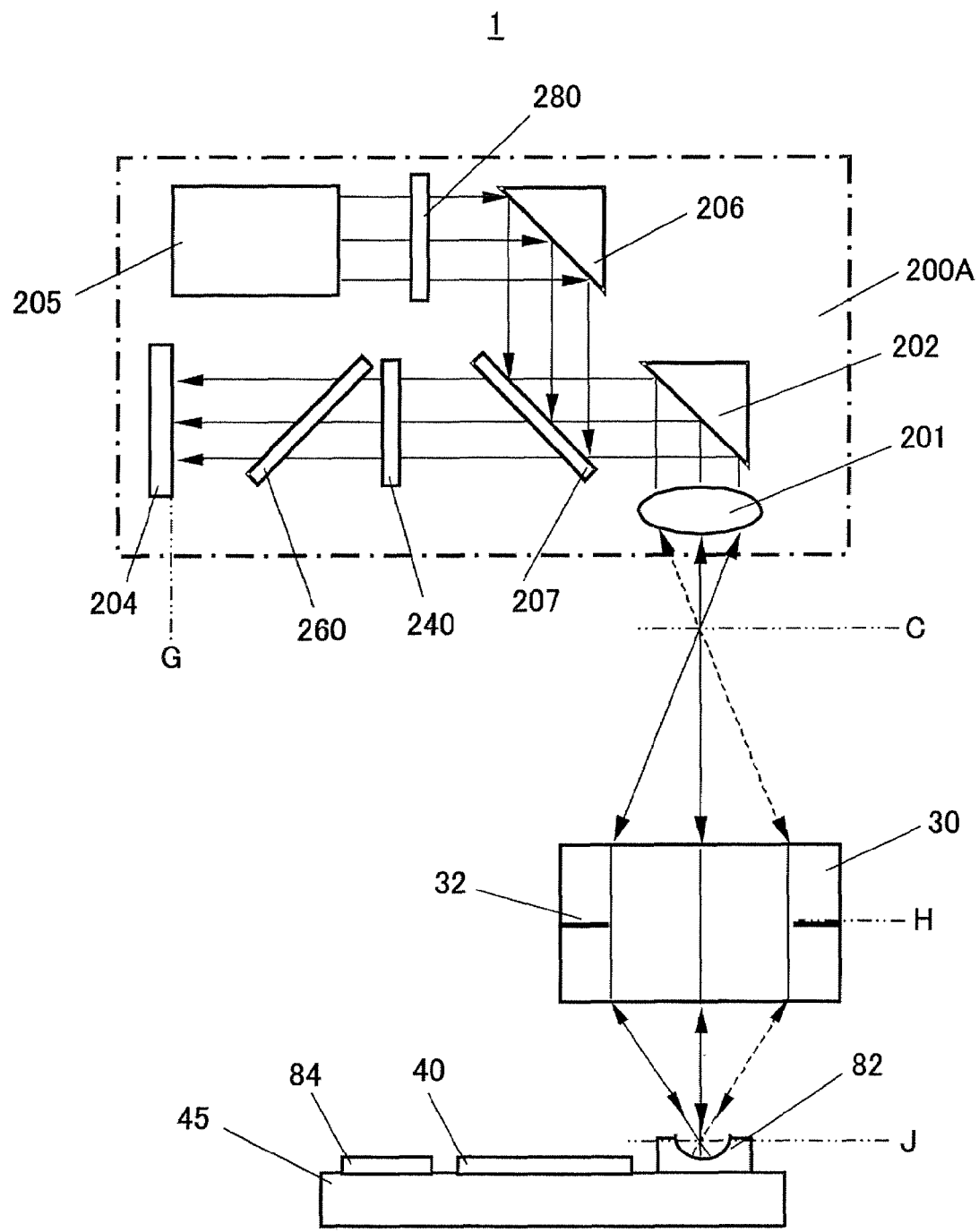
FIG. 22 is a schematic sectional view of an exposure apparatus that measures a polarization optical characteristics with high accuracy.

The eighth embodiment measures the polarization optical characteristic with high accuracy by obtaining, for example, the polarization state from a Muller matrix. FIG. 22 is a schematic sectional view of the exposure apparatus 1 that measures the polarization optical characteristic with high accuracy.

If the polarization optical characteristic is measured with high accuracy, a polarization controller element 280 is arranged at optical path of the observation optical system 200A as shown in FIG. 22 and the detected (observed) polarization state is changed and measured.

The polarization controller element 280 includes two wavelength plates, the λ/2 wavelength plate and the λ/4 wavelength plate. In the polarization controller 280, the two wavelength plates are configured rotatable. The polarization controller element 280 changes the polarization state of the light into four polarization states, a linearly polarized light (X direction), a linearly polarized light (Y direction), a linearly polarized light (45 degrees direction), and a circularly polarized light, by changing a rotation angle.

Three or more independent polarization states by rotation of the phase shifter 240 etc. are given to each of the light having such four polarization states, and the light intensity distribution is detected by the two-dimensional image sensor 204. Thereby, the Muller matrix that expresses the polarization optical characteristic of the projection optical system 30 can be obtained.

Moreover, the depolarization element may be included in the polarization controller element 280. Thereby, the unpolarized light (random polarized light) can be included in the polarization state of the light and the polarization optical characteristic can be measured in five polarization states. However, the depolarization element must be located on and removed from the optical path.

Ninth Embodiment

Figure 23:
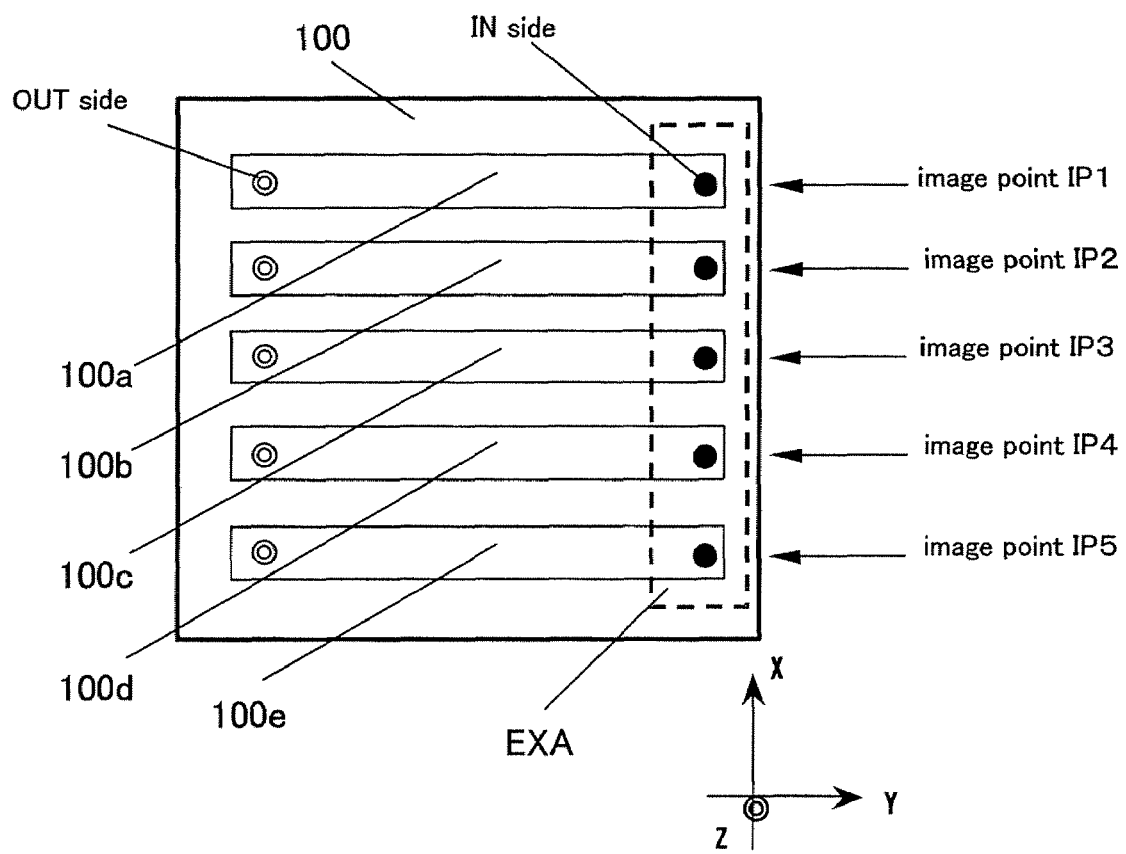
FIG. 23 is a schematic top view of an optical unit when an exposure apparatus is a scanner.
Figure 24:
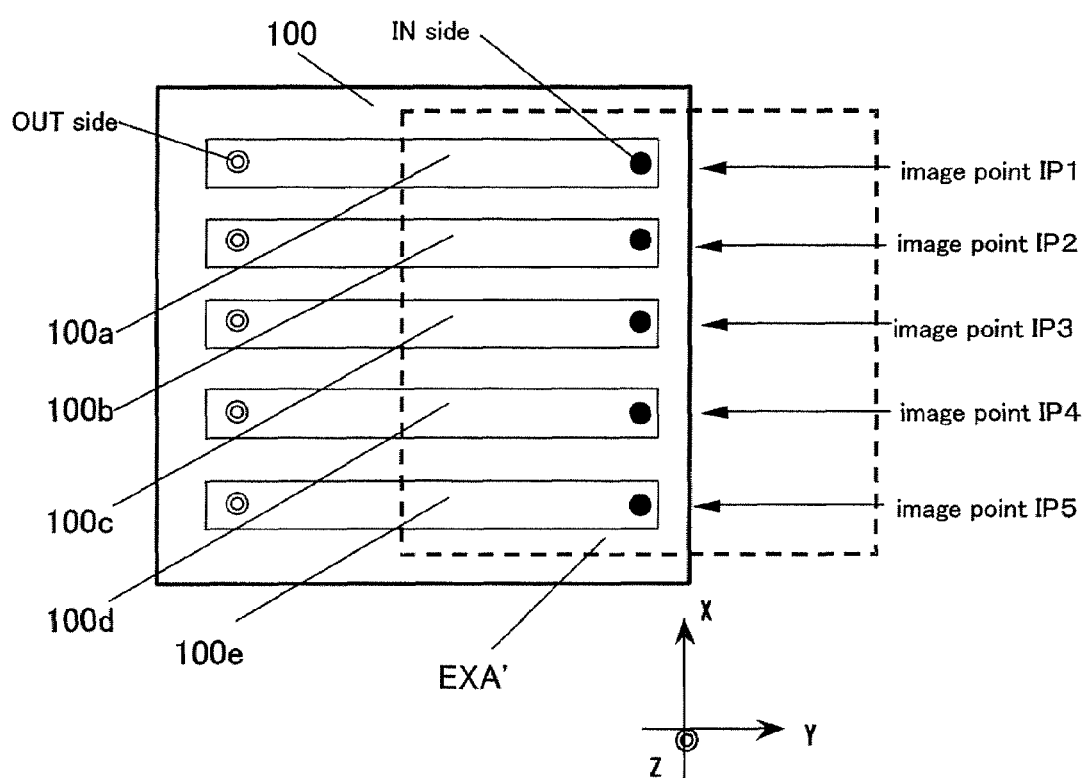
FIG. 24 is a schematic top view of an optical unit when an exposure apparatus is a stepper.

A description will be given of a relationship between the optical unit 100 and an image point in an exposure area of the exposure apparatus 1. FIGS. 23 and 24 are schematic top view of the optical unit 100. Here, a description will be given the optical unit 100 as an example. However, the optical units 100A to 100C are the same as the optical unit 100.

The optical unit 100 includes, as shown in FIGS. 23 and 24, plural unit optical systems 100a to 100e. The unit optical systems 100a to 100e are an optical system constituted inside optical unit 100, such as the pinhole 101, the Fourier transformation lens 102 and the relay optical system 104.

In FIGS. 23 and 24, a black circle indicated to be "IN side" shows an incident side that the light from the illumination optical system 18 is incident upon the optical unit 100 (unit optical systems 100a to 100e), and a double circle indicated to be "OUT side" sows a detection side that detects (observes) by the observation optical system 200.

In FIG. 23, the exposure apparatus 1 is a scanner, and EXA is the exposure area. The unit optical system 100c is arranged at a position on on-axis within the exposure area EXA, the optical systems 100a, 100b, 100d and 100e are arranged at five image points (image points IP1 to IP5) at equal intervals. For example, if the optical characteristic in the image point IP1 of the unit optical system 100a, the observation optical system 200 is moved in X direction and the position of the double circle indicated to be "OUT side" in the unit optical system 100a is detected.

In FIG. 24, the exposure apparatus 1 is a stepper, and EXA' is the exposure area. When the measurement position is changed in Y direction within the exposure area EXA', the reticle stage 25 that supports the optical unit 100 is driven in Y direction and the observation optical system 200 is moved in X direction. Then, the position of the double circle indicated to be "OUT side" in the unit optical system 100a is detected.

The unit optical systems 100a to 100e may be a cartridge system exchangeable in each image point position within the optical unit 100. A relative error in the measurement of the unit optical systems 100a to 100e does not occur. For example, the unit optical system 100c arranged at the image point IP3 on on-axis is changed for the image points IP1 to IP5, and all image points may be measured by the same unit optical system 100c. Moreover, a measurement result in the image point IP1 by the unit optical system 100a and a measurement result in the image point IP1 by the unit optical system 100c are compared. Such comparison is similarly executed to the image point IP2, the image point IP4 and the image point IP5, and a measurement difference to each image point on basis of the unit optical system 100c is stored in the memory of the controller 60. Then, the measurement difference on the basis of the unit optical system 100c is deducted from the measurement result in the image point IP1 by the unit optical system 100a as the offset. Thereby, the same effect as the case that all image points are measured by the same unit optical system 100c can be obtained.

Tenth Embodiment

Figure 25:
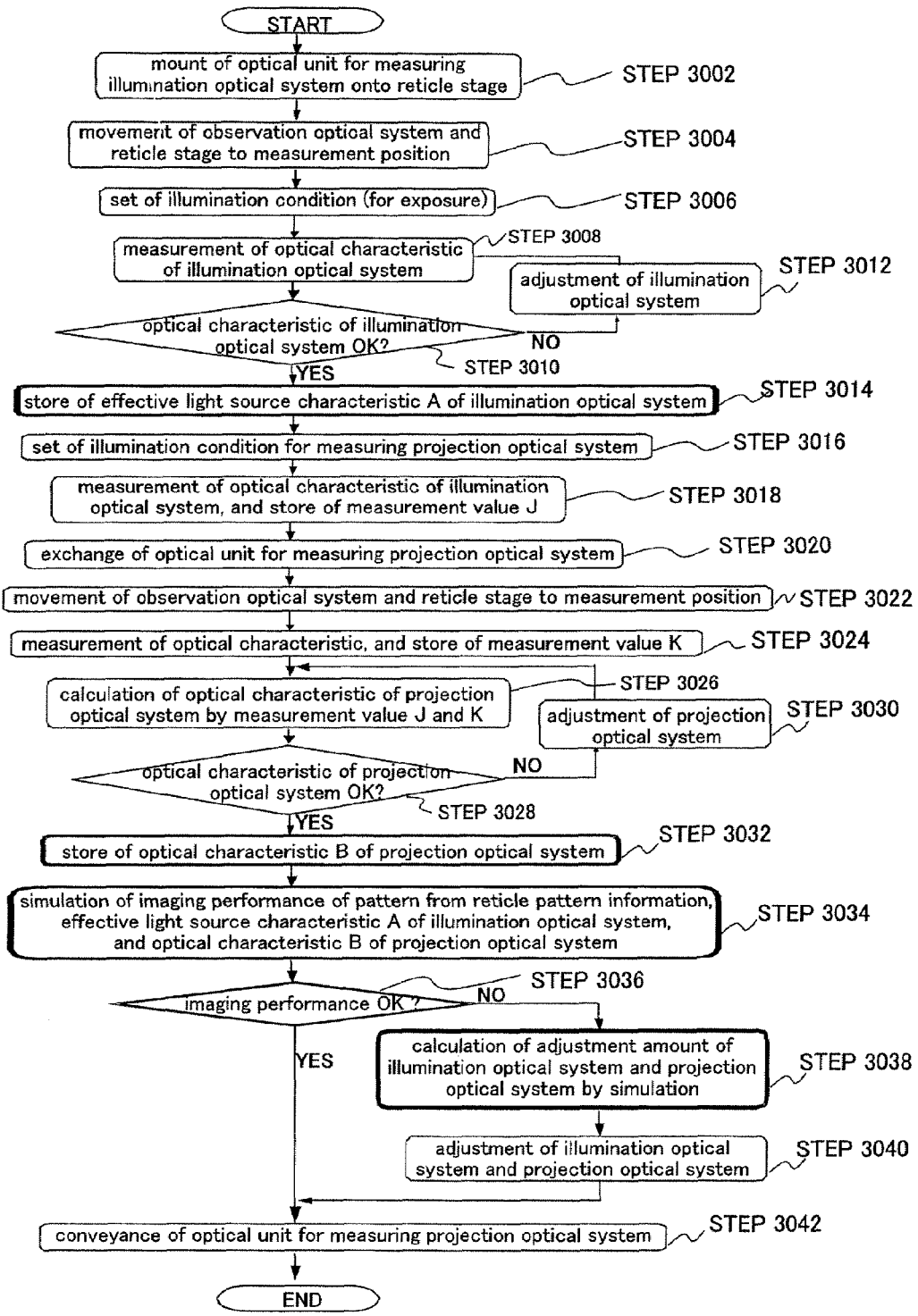
FIG. 25 is a flowchart for explaining an optimization of imaging performance of an exposure optical system.

A description will be given of an optimization of imaging performance of the whole of the illumination optical system 18 and the projection optical system 30 (exposure optical system). FIG. 25 is a flowchart for explaining the optimization of imaging performance of the exposure optical system. The optical unit 100 (or 100B, 100C) for measuring the optical characteristic of the illumination optical system 18 and the optical unit 100A for measuring the optical characteristic of the projection optical system 30 are accommodated in the reticle stocker 50 beforehand.

Referring to FIG. 25, first, the optical unit 100 for measuring the optical characteristic of the illumination optical system 18 is mounted on the reticle stage 25 (step 3002), and the reticle stage 25 and the observation optical system 200 is moved to the measurement position (step 3004).

Next, the illumination condition that is set to JOB at transferring the pattern (exposure) is set (step 3006), and the optical characteristic of the illumination optical system 18 is measured (step 3008). The optical characteristic measured by step 3008 is judged (step 3010), if the optical characteristic is not good, the optical characteristic of the illumination optical system 18 is adjusted (step 3012). If the optical characteristic measured by step 3008 is good, an effective light source characteristic A of the illumination optical system 18 is stored in the memory of the controller 60 (step 3014).

Next, the illumination condition ($\sigma$=1 or more) for measuring the optical characteristic of the projection optical system 30 is set (step 3016). In this state, the optical characteristic of the illumination optical system 18 is measured, and the measurement value is stored in the memory of the controller 60 as J (step 3018).

Next, the optical unit 100 is conveyed, and the optical unit 100A for measuring the optical characteristic of the projection optical system 30 is mounted on the mask stage 25 (step 3020). The reticle stage 25 and the observation optical system 200 are moved to a measurement position (step 3022). In this state, the optical characteristic is measured, and the measurement value is stored in the memory of the controller 60 as K (step 3024).

Next, the optical characteristic of the projection optical system 30 is calculated from the measurement value J and the measurement value K (step 3026). The optical characteristic of the projection optical system 30 can be obtained using the measurement value K of the exposure optical system and the measurement value J as the optical characteristic of the illumination optical system 18 as explained in second embodiment.

The optical characteristic of the projection optical system 30 calculated by step 3026 is judged (step 3028), if the optical characteristic is not good, the optical characteristic of the projection optical system 30 is adjusted (step 3030). If the optical characteristic of the projection optical system 30 calculated by step 3026 is good, an optical characteristic B of the projection optical system 30 is stored in the memory of the controller 60 (step 3032).

Next, the imaging performance of the pattern is simulated based on the pattern information of the reticle 20, the effective light source characteristic A of the illumination optical system 18 and the optical characteristic of the projection optical system 30 (step 3034). The imaging performance by the simulation in step 3034 is judged (step 3036). This judgment is executed by a comparison of the imaging performance by the simulation and a desired imaging performance. The comparison of the imaging performance includes a uniformly CD, a HV difference and an OPE calculation.

If the imaging performance by the simulation is not good, an adjustment amount of the illumination optical system 18 and an adjustment amount of the projection optical system 30 are calculated by the simulation (step 3038). The illumination optical system 18 and the projection optical system 30 are adjusted based on the adjustment amount calculated by step 3038 (step 3040). The adjustment of the illumination optical system 18 and the projection optical system 30 includes an adjustment of the aberration and numerical aperture of the projection optical system 30, an adjustment of the telecentricty, an adjustment of form and light intensity of the effective light source distribution and an adjustment of the degree of polarization etc. These are optimized to plural positions in the exposure area.

If the imaging performance by the simulation is good, the optical unit 100A for measuring the optical characteristic of the projection optical system 30 is conveyed from the reticle stage 25 (step 3042). Moreover, if the adjustment of the illumination optical system 18 and projection optical system 30 are completed, the optical unit 100A is conveyed from the reticle stage 25.

Figure 26:
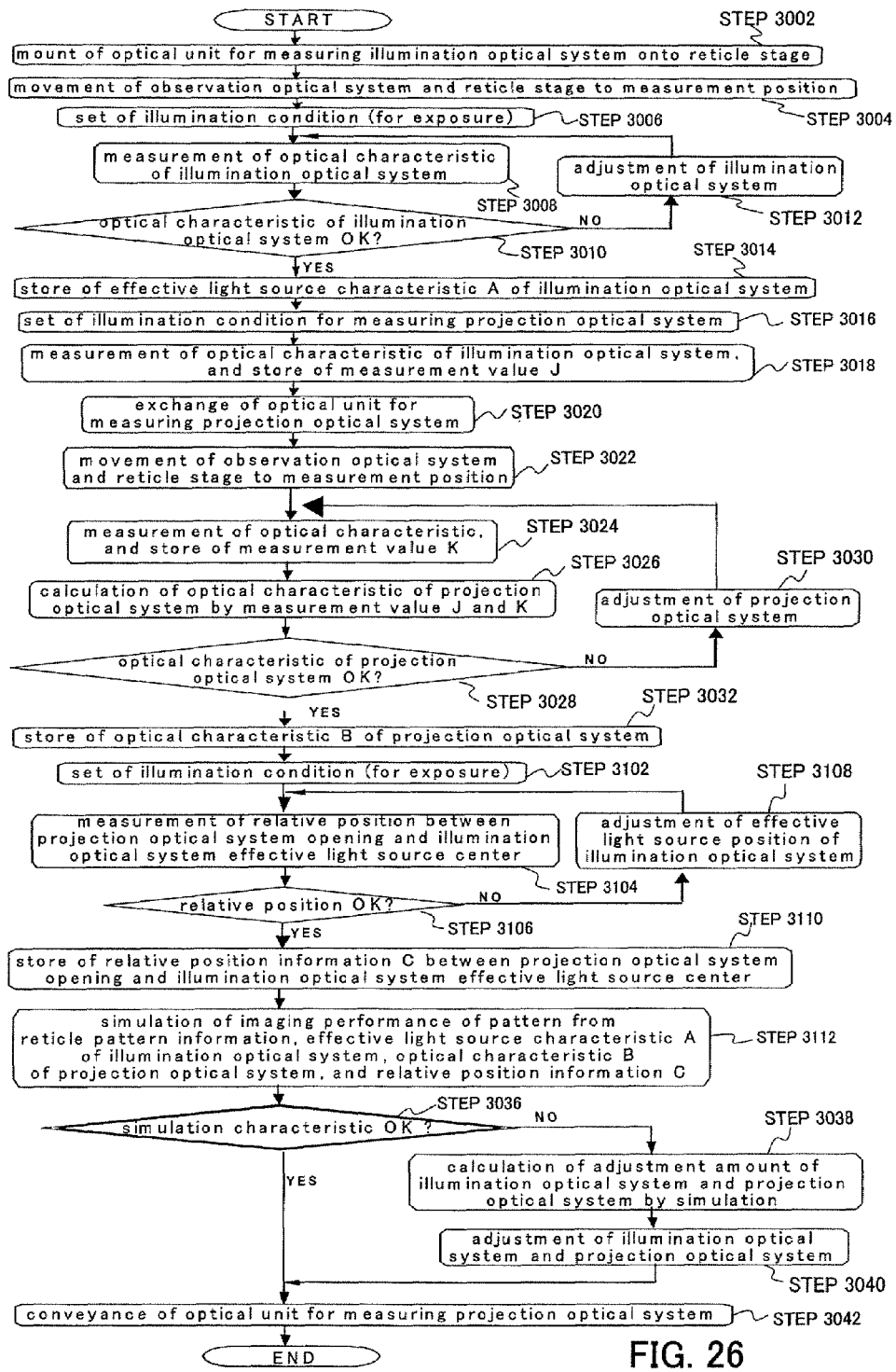
FIG. 26 is a flowchart for explaining an optimization of imaging performance of an exposure optical system.

The optimization of imaging performance of the exposure optical system shown in FIG. 25 can also execute a relative alignment between a pupil position in the illumination optical system 18 and a pupil position in the projection optical system 30. FIG. 26 is a flowchart for explaining a optimization of imaging performance of the exposure optical system that includes steps of the alignment between the pupil position in the illumination optical system 18 and the pupil position in the projection optical system 30.

The optimization shown in FIG. 26 is different from the optimization shown in FIG. 25 in that the optimization shown in FIG. 26 has steps 3102 to 3112 between step 3032 and step 3036. Hereinafter, a description will be given of steps 3102 to step 3112.

If the optical characteristic B of the projection optical system 30 is stored in the memory of the controller 60 (step 3032), the illumination condition that is set to JOB at transferring the pattern (exposure) is set (step 3102) in the illumination optical system.

Next, the relative position between a pupil center position in the projection optical system 30 obtained from the image of the aperture stop 32 of the projection optical system 30 and the effective light source center (pupil center position) of the illumination optical system 18 obtained from the effective light source light intensity distribution of the illumination optical system 18 is measured (step 3014).

If the relative position between the pupil center position in the illumination optical system 18 and the pupil center position in the projection optical system 30 is not good, the effective light source position in the illumination optical system 18 is adjusted (step 3108). At this time, in the adjustment of the effective light source position in the illumination optical system 18, the optimization is executed by distributing a coincidence error to plural points on on-axis and off-axis.

If the relative position between the pupil center position in the illumination optical system 18 and the pupil center position in the projection optical system 30 is good, the relative position information between an opening center in the projection optical system 30 and the effective light source center in the illumination optical system is stored in the memory of the controller 60 as C (step 3110).

Next, the imaging performance of the pattern is simulated based on the pattern information of the reticle 20, the effective light source characteristic A of the illumination optical system 18 and the relative position information C (step 3112). The imaging performance by the simulation in step 3112 is judged (step 3036). Subsequent steps are the same as the above.

Eleventh Embodiment

Figure 27:
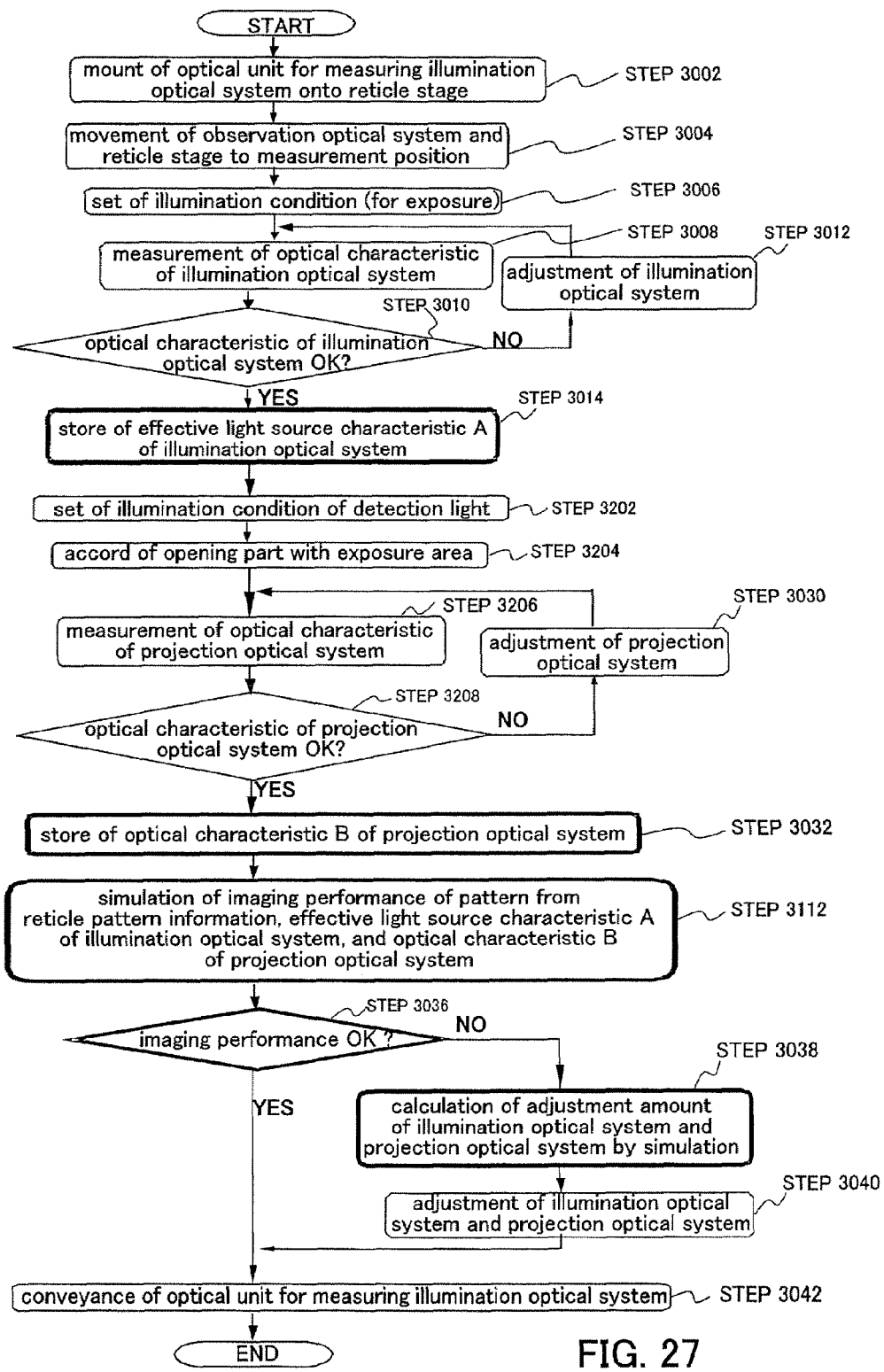
FIG. 27 is a flowchart for explaining an optimization of imaging performance of an exposure optical system in an eleventh embodiment.
Figure 28:
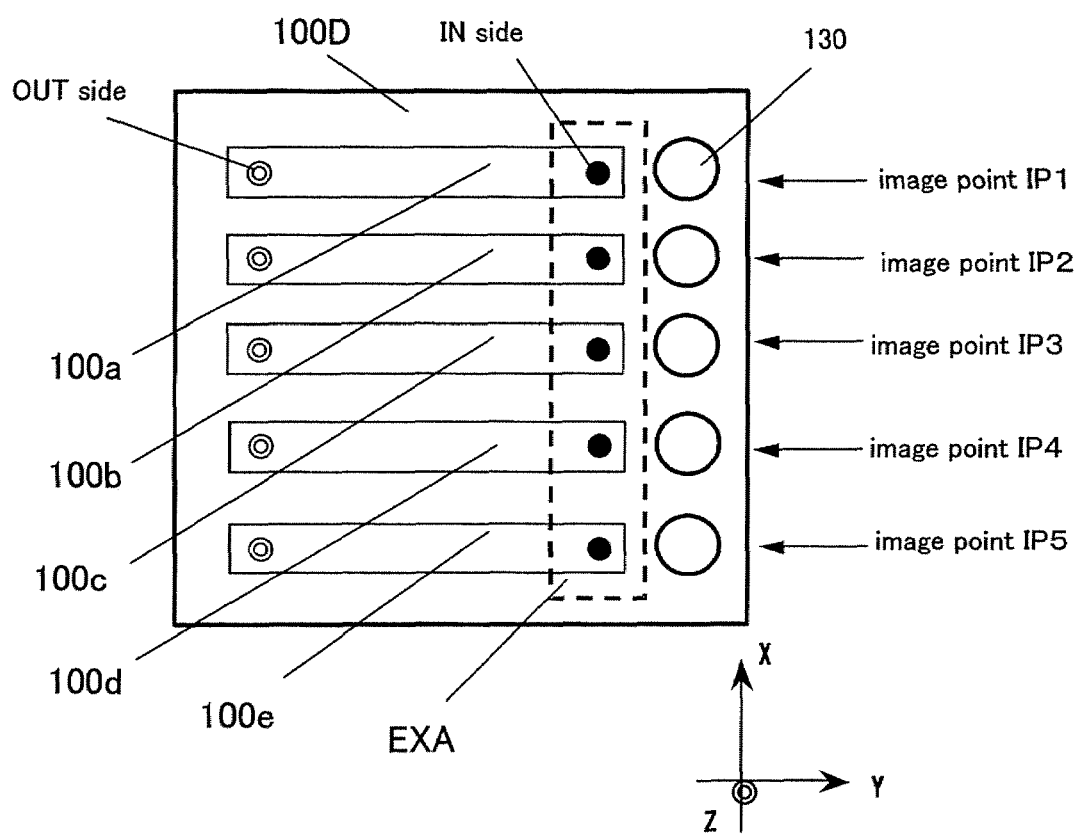
FIG. 28 is a schematic top view of an optical unit used for an eleventh embodiment.
Figure 29:
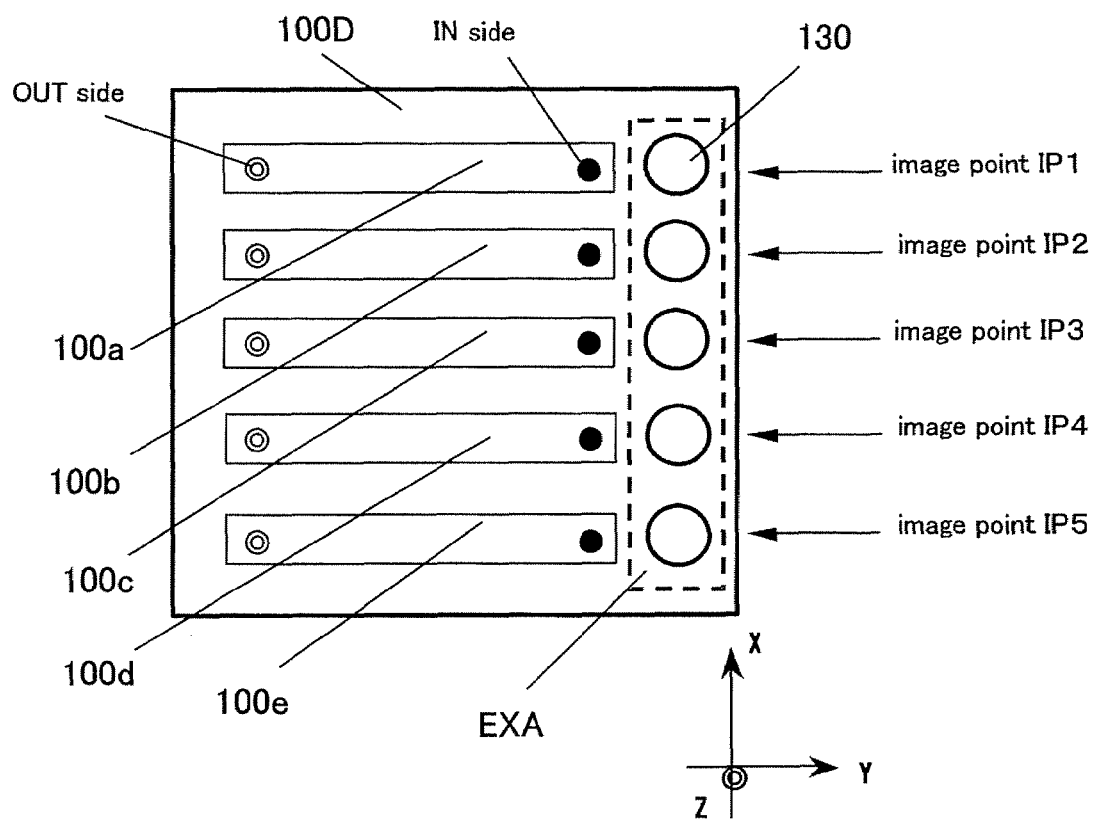
FIG. 29 is a schematic top view of an optical unit used for an eleventh embodiment.

The eleventh embodiment measures the optical characteristic of the illumination optical system 18 using the optical system and measures the optical characteristic of the projection optical system 30 without using the optical unit. The eleventh embodiment uses only one optical unit, and can shorten a measurement time. FIG. 27 is a flowchart for explaining an optimization of imaging performance of the exposure optical system. FIGS. 28 and 29 are schematic top views of an optical unit 100D used for the eleventh embodiment, in other words, the optimization of imaging performance of the exposure optical system shown in FIG. 27.

The optimization shown in FIG. 27 is different from the optimization shown in FIG. 25 in that the optimization shown in FIG. 27 does not use the optical unit 100A for measuring the optical characteristic of the projection optical system 30 between step 3014 and step 3206 (the measurement of the optical characteristic of the projection optical system 30).

In step 3002, the optical unit on the stage 25 is the optical unit 100D shown in FIGS. 28 and 29.

The optical unit 100D is different from the optical unit 100 shown in FIGS. 23 and 24 in that the optical unit 100D further includes an aperture 130. If the optical characteristic of the illumination optical system 18 is measured using the optical unit 100D, the exposure area EXA of the exposure apparatus 1 is accorded with the black circle that shows "IN side" and the observation optical system 200A is accorded with the double circle that shows "OUT side" as shown in FIG. 23. In this state, the optical characteristic of the illumination optical system 18 is measured (step 3008).

In the eleventh embodiment, the measurement of optical characteristic of the projection optical system 30 is executed by the structure shown in the third embodiment (FIG. 13). Then, the illumination condition of detection (observation) light of the observation optical system 200A is set to the illumination condition ($\sigma=1$ or more) for measuring the optical characteristic of the projection optical system 30 (step 3202).

Next, the reticle stage 25 is moved to measure the optical characteristic of the projection optical system 30 while the optical system 100D has been mounted on the reticle stage 25 (step 3204). Concretely, the exposure area EXA is accorded with the opening part 130. In this state, the observation optical system 200A is accorded with the double circle that shows "OUT side", and the optical characteristic of the projection optical system 30 is measured (step 3206). The optical characteristic of the projection optical system is judged (step 3028). Subsequent steps are the same as the above.

In the first to eleventh embodiments, although the exposure apparatus 1 includes the observation optical system 200, the optical unit 100 may include the observation optical system 200 if the observation optical system 200 can be attached in the optical unit 100. In this case, a power source for measurement is built in the optical unit 100, the measurement result may be stored in a memory included in the optical unit 100 and may be send to the controller 60 by wireless.

In the first to eleventh embodiments, although the measurement offset is measured by using the unpolarized light (random polarized light), the measurement offset may be measured by using in accordance with a specific (known) polarization state. For example, the structure that can change the phase shifter to the same position in addition to the depolarization element 72 shown in FIG. 6 or 17 is considered. This structure can change the polarization state of the light into four polarization states, a linearly polarized light (X direction), a linearly polarized light (Y direction), a linearly polarized light (45 degrees direction), and a circularly polarized light, by changing the kind of the provided phase shifter and the rotation angle of the phase shifter. Then, the measurement offset is measured in five states including the state of unpolarized light (random light). Thereby, the measurement offset can be obtained with high accuracy. The provided phase shifter includes two wavelength plates of the $\lambda/2$ wavelength plate and the $\lambda/4$ wavelength plate, and each of wavelength plate is configured rotatable.

Moreover, a wavefront aberration of the projection optical system 30 and information of a polarization wavefront aberration can be measured by adding a function of an interferometer to the observation optical system 200A.

Thus, the exposure apparatus 1 does not need a new space but can measure the optical characteristic of the illumination optical system and/or projection optical system using the observation optical system by using the optical units 100 to 100D that have the same form as the reticle 20. Moreover, the exposure apparatus 1 can measure the polarization state with high accuracy irrespective of the optical characteristic of the exposure apparatus that has high NA and a wet (immersion) or dry at wafer side of the projection optical system.

The exposure apparatus 1 not only can adjust the optical characteristic of each of the illumination optical system and the projection optical system that constitute the exposure optical system, but can measure and adjust the optical characteristic of the whole of the illumination optical system and the projection optical system.

The exposure apparatus 1 can correctly specify the deteriorated optical element (in other words, the optical element to be exchanged).

In the exposure apparatus 1, the simulation of the imaging performance can be executed using the measured optical characteristic of the illumination optical system 18 and measured optical characteristic of the projection optical system 30, and the adjustment state of the illumination optical system and projection optical system can be set to the optimal state.

In exposure, the light emitted from the light source 12, e.g., Koehler-illuminates the reticle 20 via the illumination optical system 18. The light that passes the reticle 20 and reflects the reticle pattern is imaged onto the wafer 40 by the projection optical system 30. The exposure apparatus 1 can set the optical characteristic of the illumination optical system 18 and projection optical system 30 to the optimal state. Moreover, the exposure apparatus 1 can measure the polarization state with high accuracy. Therefore, the exposure apparatus 1 can form the desired polarization state with sufficient reproducibility by correcting the polarization state of the illumination optical system based on the measurement result. Thereby, the exposure apparatus 1 can provide high-quality devices (such as semiconductor devices, LCD devices, photographing devices (such as CCDs, etc.), thin film magnetic heads, and the like) with high throughput and economic efficiency.

Twelfth Embodiment

Figure 30:
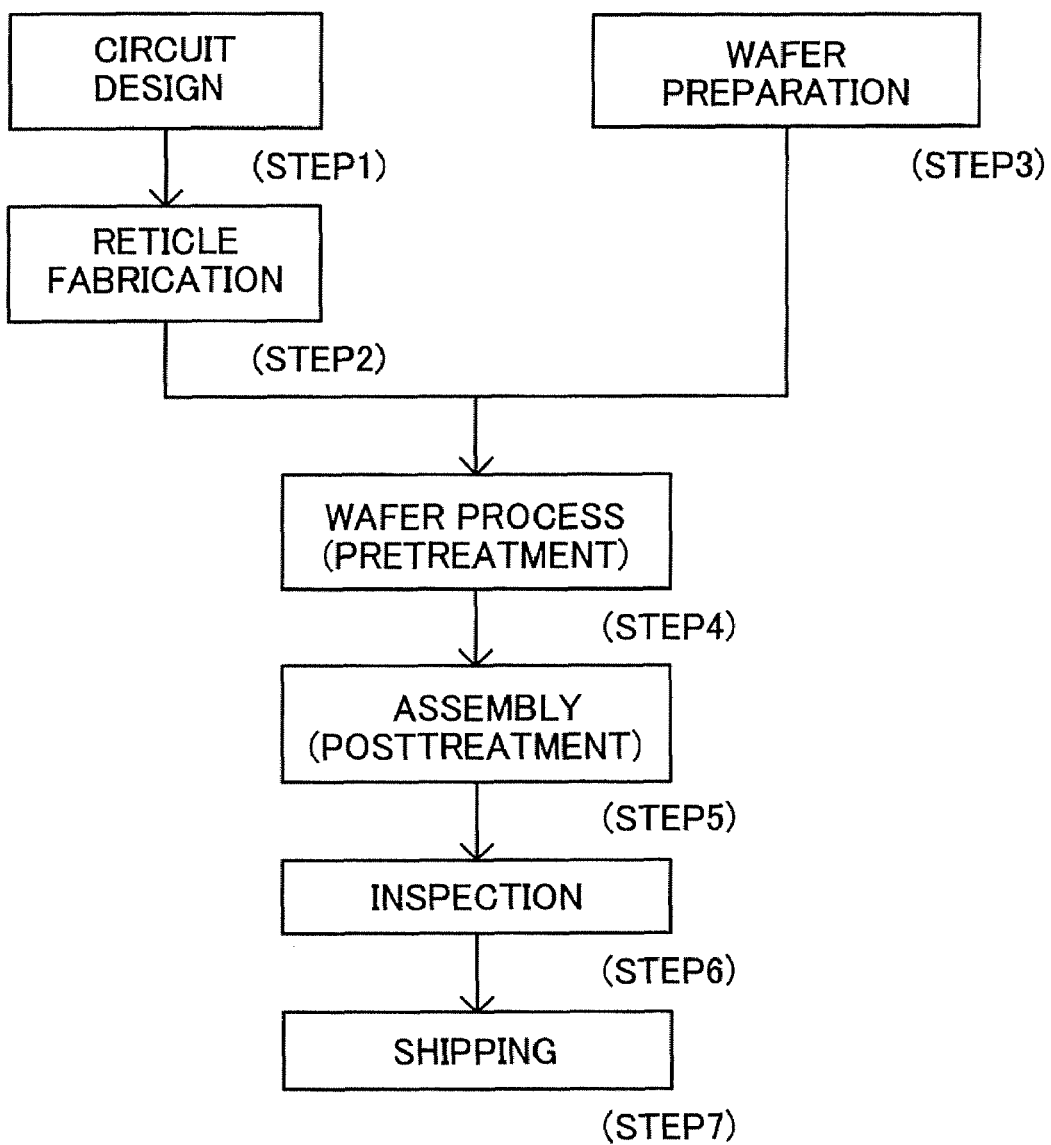
FIG. 30 is a flowchart for explaining a method for fabricating devices (semiconductor chips such as ICs, LSIs, and the like, LCDs, CCDs, etc.).
Figure 31:
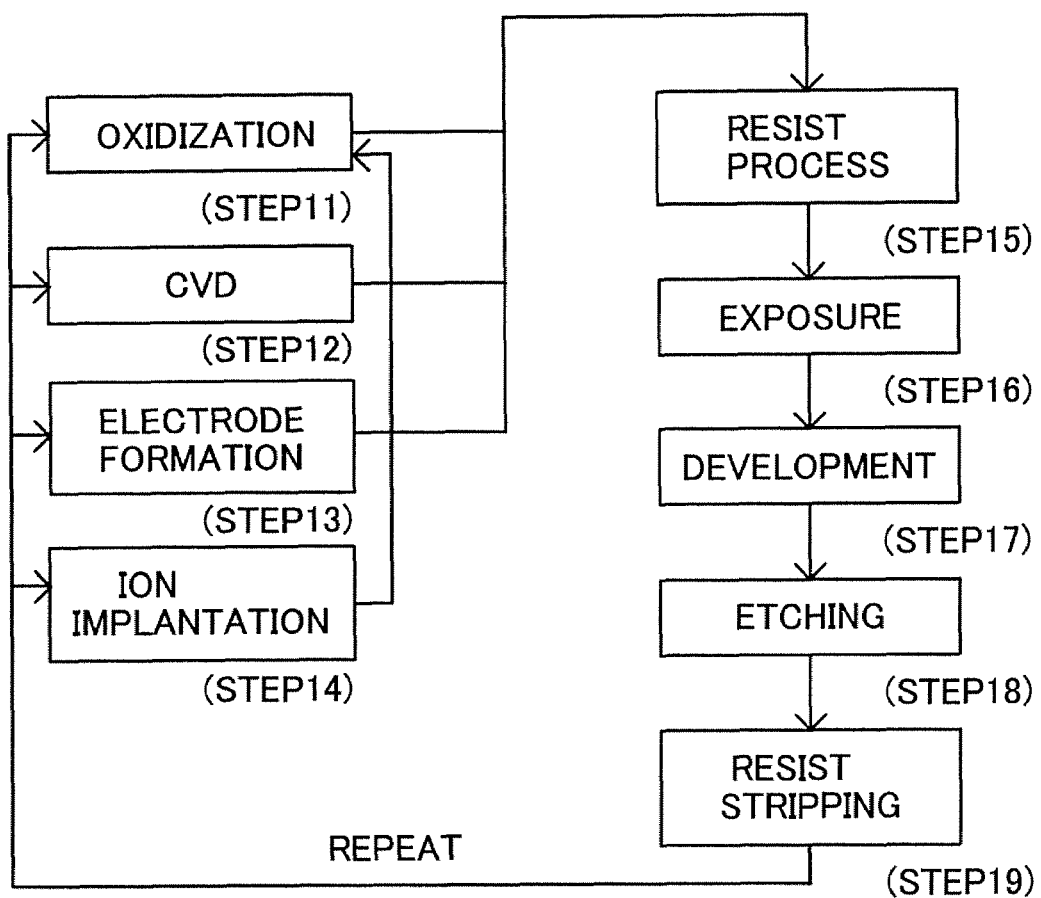
FIG. 31 is a detail flowchart of a wafer process in Step 4 of FIG. 30.

Referring now to FIGS. 30 and 31, a description will be given of an embodiment of a device fabrication method using the above mentioned exposure apparatus 1. FIG. 30 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 31 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 1 to expose a circuit pattern of the reticle onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. These steps are repeated to form multi-layer circuit patterns on the wafer. The device fabrication method of this embodiment may manufacture higher quality devices than the conventional one. Thus, the device fabrication method using the exposure apparatus 1, and resultant devices constitute one aspect of the present invention.

Finally, a measurement NA in the above description is preferably 0.85 or higher. The polarization illumination that needs the polarization measurement is effectively used in the exposure method with NA of 0.85 or higher.

Furthermore, the present invention is not limited to these preferred embodiments and various variations and modifications may be made without departing from the scope of the present invention.

This application claims a foreign priority benefit based on Japanese Patent Application No. 2005-242033, filed on Aug. 24, 2005, which is hereby incorporated by reference herein in its entirety as if fully set forth herein.

What is claimed is:

1. An exposure apparatus comprising:
   a reticle stage for supporting a reticle;
   an illumination optical system for illuminating the reticle;
   a projection optical system for projecting an image of a pattern of the reticle onto a substrate;
   a polarization state measuring part for measuring a polarization state; and an optical unit, supported by the reticle stage exchangeable for the reticle, for introducing a light from the illumination optical system to the polarization state measuring part, wherein said polarization state measuring part includes:
a phase shifter;
a polarization element; and
a light detector for detecting the light from the illumination optical system via the phase shifter and the polarization element.

2. An exposure apparatus according to claim 1, wherein at least one of the phase shifter and the polarization element is configured rotatable around an optical axis, and wherein said polarization state measuring part further includes a setting part that sets at least three states that are deferent in a relative rotation angle between the phase shifter and the polarization element.

3. An exposure apparatus according to claim 1, wherein said optical unit is a bilateral telecentric optical system.

4. An exposure apparatus according to claim 1, wherein said polarization state measuring part includes a pinhole, and wherein said polarization state measuring part measures the polarization state based on the light that passes a pinhole in the pinhole member.

5. An exposure apparatus according to claim 1, wherein said projection optical system has a NA of 0.85 or higher.

6. An exposure apparatus comprising:
a substrate stage for supporting a substrate;
a projection optical system for projecting an image of a pattern of a reticle onto the substrate;
a polarization state measuring part for measuring a polarization state; and
a mirror, provided on the substrate stage, for reflecting a light exited from the projection optical system and introducing the light to the projection optical system,
wherein said polarization state measuring part includes:
a phase shifter;
a polarization element; and
a light detector,
wherein said light detector detects the light that passes the projection optical system, the mirror, the projection optical system, the phase shifter and the polarization element in this order.

7. An exposure apparatus comprising:
a reticle stage for supporting a reticle;
an illumination optical system for illuminating the reticle;
a substrate stage for supporting a substrate;
a projection optical system for projecting an image of a pattern of the reticle onto the substrate;
a polarization state measuring part for measuring the polarization state;
an optical unit supported by the reticle stage exchangeable for the reticle; and
a mirror, provided on the substrate stage, for reflecting a light exited from the projection optical system and introducing the light to the projection optical system,
wherein said polarization state measuring part includes:
a phase shifter;
a polarization element; and
a light detector,
wherein said light detector detects the light from the illumination optical system through the projection optical system, the mirror, the projection optical system, the optical unit, the phase shifter and the polarization element in this order.

8. An exposure method for exposing a substrate using an illumination optical system that illuminates a reticle and a projection optical system that projects an image of a pattern of the reticle onto the substrate, said exposure method comprising:

a first measurement step of measuring a polarization state of a light to illuminate the reticle;
a second measurement step of measuring a polarization characteristic of the projection optical system; and
a calculation step of calculating an imaging state of the image of the pattern based on measurement results by the first and second measurement steps.

9. An exposure method according to claim 8, further comprising a changing step of changing the polarization state of the light to illuminate the reticle.

10. An exposure apparatus comprising:
a reticle stage for supporting a reticle;
an illumination optical system for illuminating the reticle;
a projection optical system for projecting an image of a pattern of the reticle onto a substrate;
a polarization state measuring part for measuring a polarization state; and
an optical unit, supported by the reticle stage exchangeable for the reticle, for introducing a light from the illumination optical system to the polarization state measuring part.

11. An exposure apparatus comprising:
a substrate stage for supporting a substrate;
a projection optical system for projecting an image of a pattern of a reticle onto the substrate; a polarization state measuring part for measuring a polarization state; and
a mirror, provided on the substrate stage, for reflecting a light exited from the projection optical system and introducing the light to the projection optical system.

12. An exposure apparatus comprising:
a reticle stage for supporting a reticle;
an illumination optical system for illuminating the reticle;
a substrate stage for supporting a substrate;
a projection optical system for projecting an image of a pattern of the reticle onto the substrate;
a polarization state measuring part for measuring the polarization state;
an optical unit supported by the reticle stage exchangeable for the reticle; and
a mirror, provided on the substrate stage, for reflecting a light exited from the projection optical system and introducing the light to the projection optical system.

13. A device fabrication method comprising the steps of:
exposing a substrate using an exposure apparatus; and
performing a development process for the substrate exposed,
wherein the exposure apparatus performs further steps comprising:
supporting a reticle by a reticle stage;
illuminating the reticle by an illumination optical system;
projecting an image of a pattern of the reticle onto a substrate by a projection optical system;
measuring a polarization state by a polarization state measuring part; and
introducing a light from the illumination optical system to the polarization state measuring part by an optical unit, supported by the reticle stage exchangeable for the reticle,
wherein said measuring step by the polarization state measuring part includes:
shifting a phase by a phase shifter;
polarizing by a polarization element; and
detecting by a light detector the light from the illumination optical system via the phase shifter and the polarization element.

* * * * *